(12) United States Patent
Kim et al.

(10) Patent No.: US 11,575,377 B2
(45) Date of Patent: Feb. 7, 2023

(54) SWITCHING CIRCUIT, GATE DRIVER AND METHOD OF OPERATING A TRANSISTOR DEVICE

(71) Applicant: Infineon Technologies Austria AG, Villach (AT)

(72) Inventors: Hyeongnam Kim, Chandler, AZ (US); Alain Charles, Redondo Beach, CA (US); Mohamed Imam, Chandler, AZ (US); Qin Lei, Chandler, AZ (US); Chunhui Liu, Tempe, AZ (US)

(73) Assignee: Infineon Technologies Austria AG, Villach (AT)

( * ) Notice: Subject to any disclaimer, the term of this patent is extended or adjusted under 35 U.S.C. 154(b) by 14 days.

(21) Appl. No.: 17/237,649

(22) Filed: Apr. 22, 2021

(65) Prior Publication Data

US 2021/0344340 A1    Nov. 4, 2021

(30) Foreign Application Priority Data

Apr. 30, 2020   (EP) ..................................... 20172551

(51) Int. Cl.
*H03K 17/687*       (2006.01)
*H01L 29/778*       (2006.01)

(52) U.S. Cl.
CPC ..... *H03K 17/6871* (2013.01); *H01L 29/7786* (2013.01); *H03K 2217/0063* (2013.01); *H03K 2217/0072* (2013.01); *H03K 2217/0081* (2013.01)

(58) Field of Classification Search
CPC ....... H03K 17/6871; H03K 2217/0063; H03K 2217/0072; H01L 29/7786
See application file for complete search history.

(56) References Cited

U.S. PATENT DOCUMENTS

| | | | |
|---|---|---|---|
| 7,875,907 B2 | 1/2011 | Honea et al. | |
| 2009/0206363 A1 | 8/2009 | Machida et al. | |
| 2014/0292395 A1 | 10/2014 | Wu et al. | |
| 2015/0200661 A1* | 7/2015 | Jeon | H03K 17/161 327/109 |
| 2018/0062633 A1* | 3/2018 | Nomura | H03K 3/012 |
| 2020/0044554 A1 | 2/2020 | Penzo et al. | |

FOREIGN PATENT DOCUMENTS

DE    102019120488 A1    2/2020

OTHER PUBLICATIONS

Zojer, Bernhard, "Driving 600 V CoolGaN(tm) high electron mobilitytransistors", Infineon Technologies AG, XP002800495, [retrieved on Sep. 25, 2020].

* cited by examiner

*Primary Examiner* — Metasebia T Retebo
(74) *Attorney, Agent, or Firm* — Murphy, Bilak & Homiller, PLLC

(57) ABSTRACT

In an embodiment, a switching circuit is provided that includes a Group III nitride-based semiconductor body including a first monolithically integrated Group III nitride-based transistor device and a second monolithically integrated Group III nitride based transistor device that are coupled to form a half-bridge circuit and are arranged on a common foreign substrate having a common doping level. The switching circuit is configured to operate the half-bridge circuit at a voltage of at least 300 V.

19 Claims, 13 Drawing Sheets

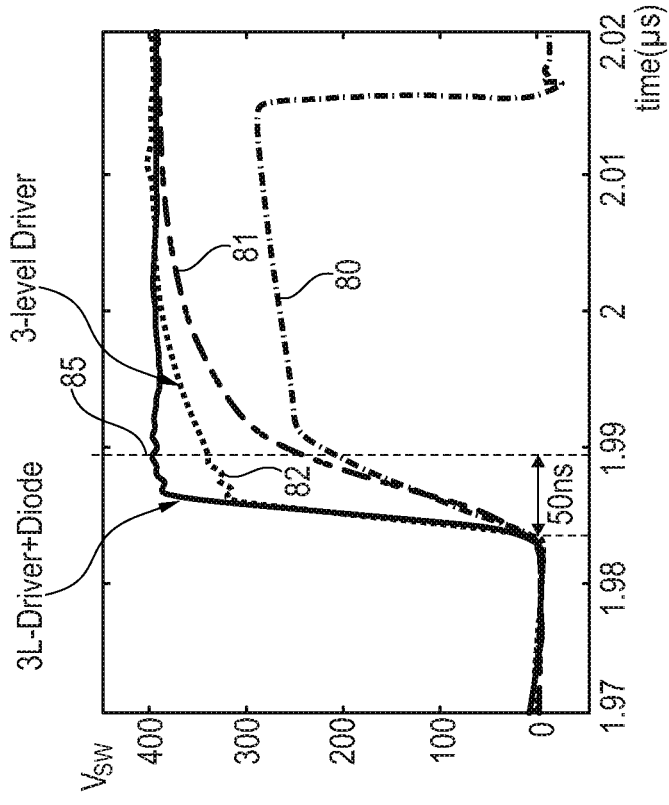
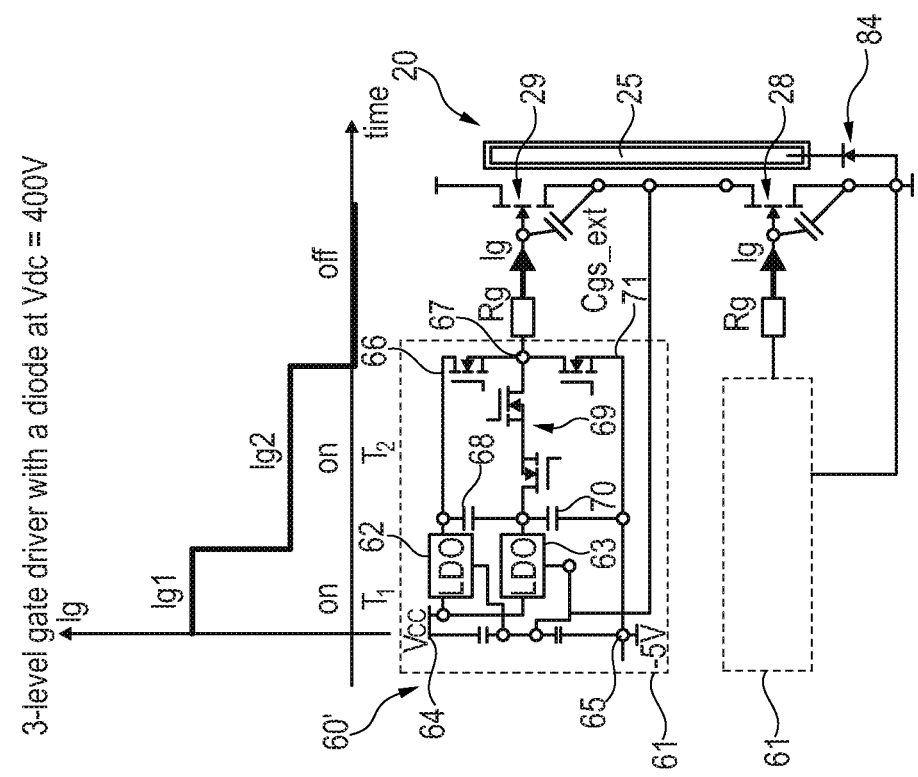
Fig. 3B
Fig. 3A

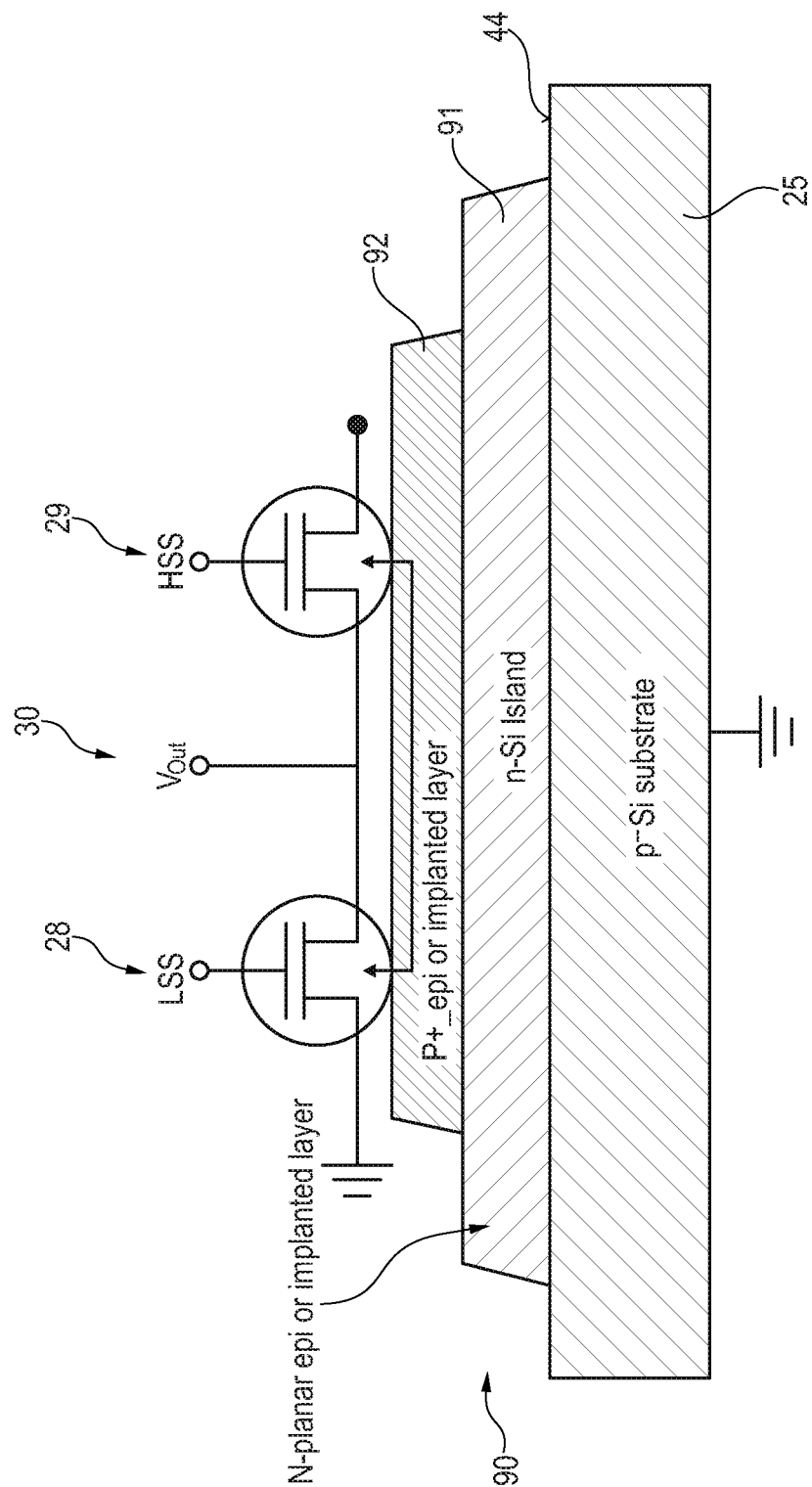

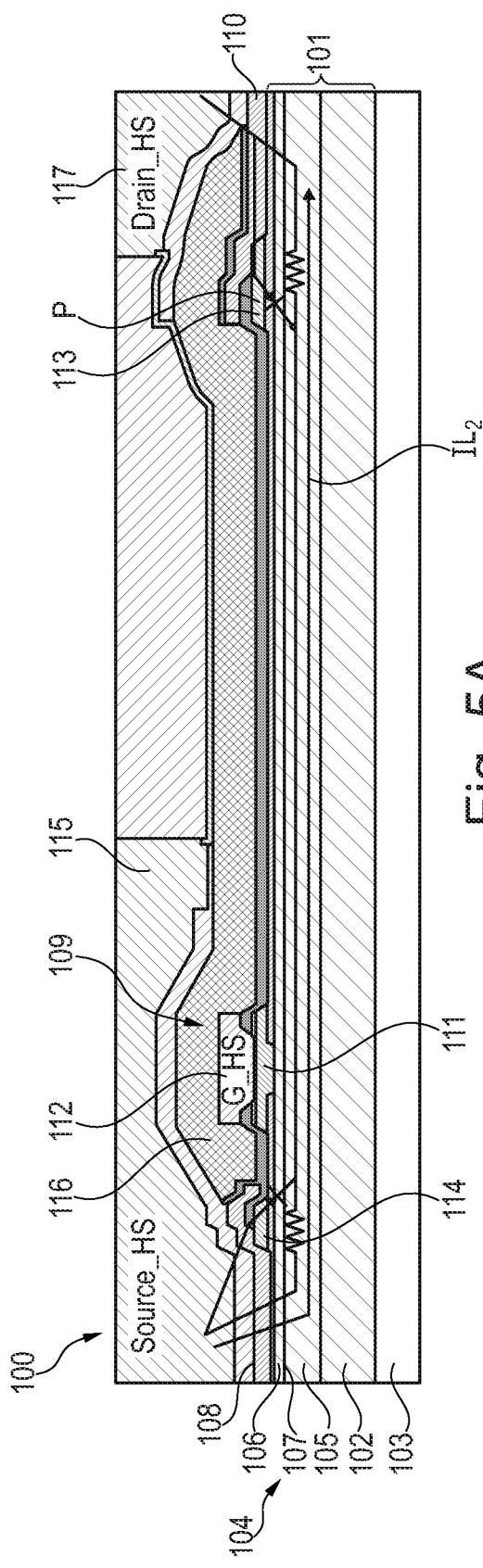
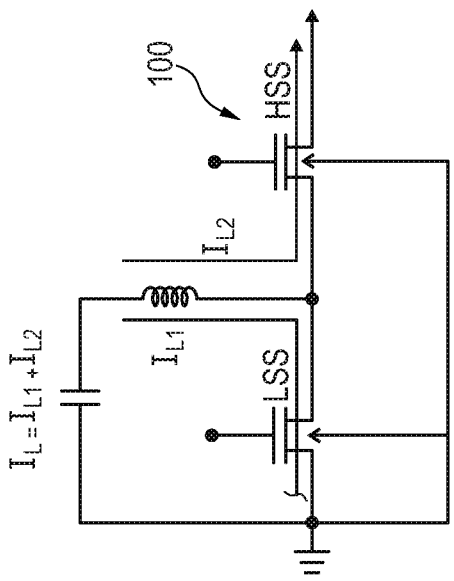
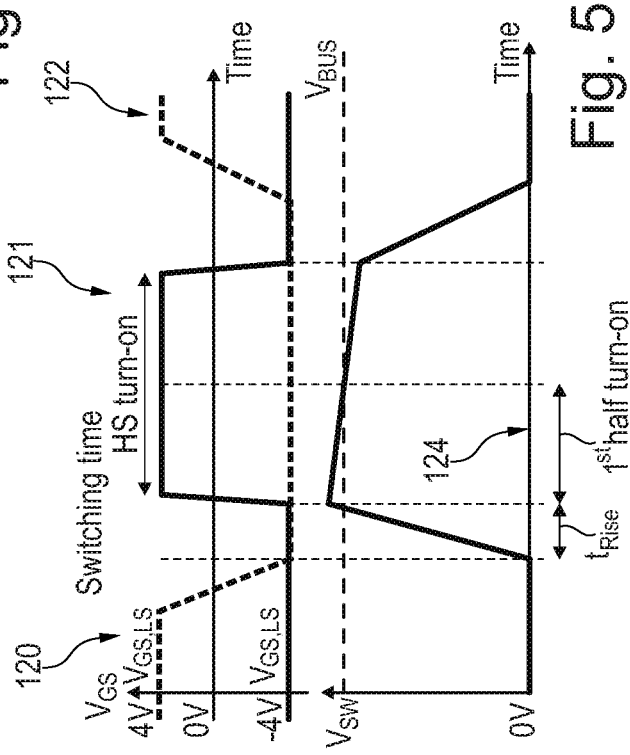
Fig. 5A
Fig. 5B
Fig. 5C

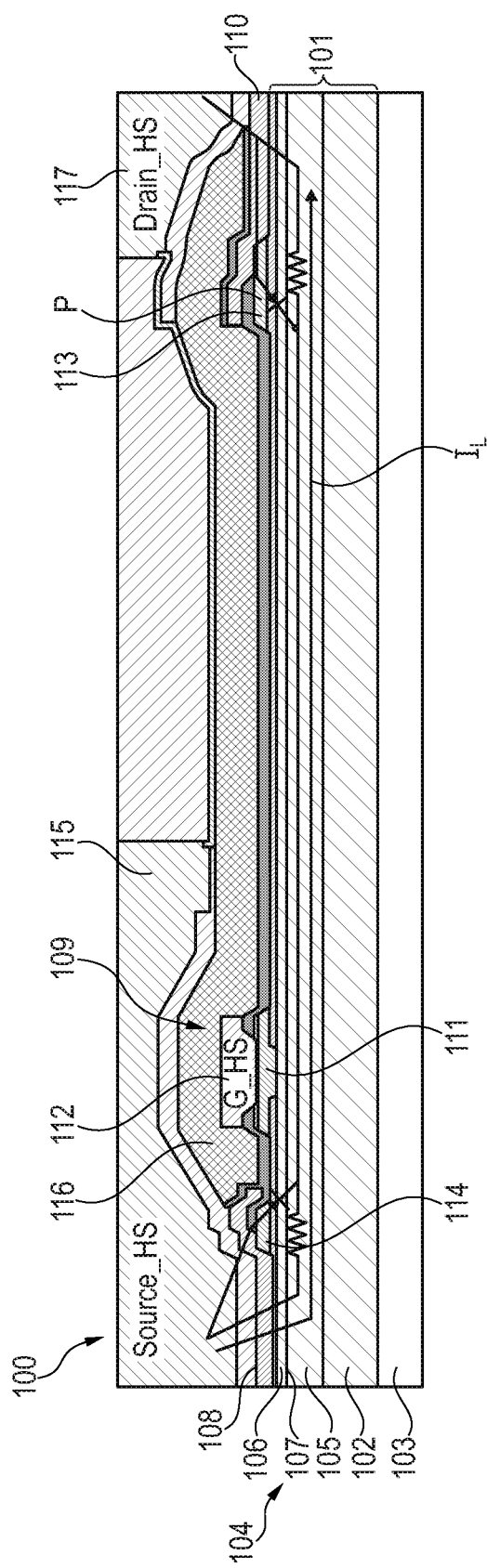
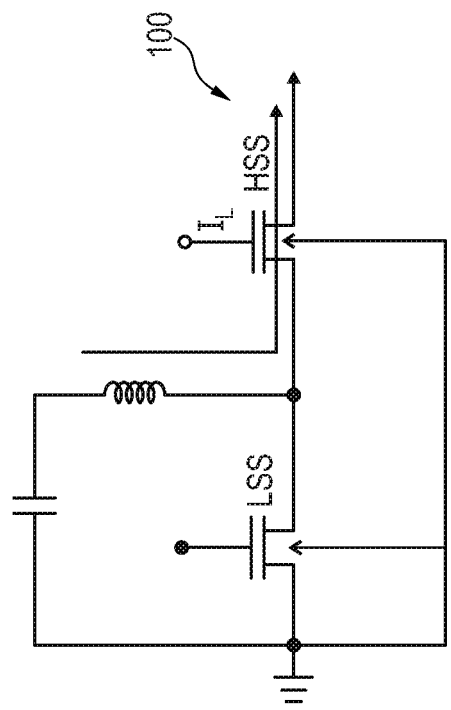
Fig. 5E
Fig. 5D

SWITCHING CIRCUIT, GATE DRIVER AND METHOD OF OPERATING A TRANSISTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). Group III nitride-based semiconductor devices, such as gallium nitride (GaN) devices, are now emerging as attractive candidates to carry large currents, support high voltages and to provide very low on-resistance and fast switching times.

Two or more Group III nitride-based semiconductor devices may be formed in a Group III nitride-based body. US 2017/0154885 A1 discloses a nitride semiconductor layer on a conductive substrate including two lateral transistor devices. The substrate includes isolation regions in the form of trenches in the substrate such that each device is positioned above a region of the substrate whose potential can be independently controlled. An isolation structure is also provided inside the nitride semiconductor layer to electrically isolate the transistor devices from each other.

Devices with two or more monolithically integrated Group III nitride-based devices that have improved operational reliability are, however, desirable.

SUMMARY

In an embodiment, a switching circuit is provided that comprises a Group III nitride-based semiconductor body comprising a first monolithically integrated Group III nitride-based transistor device and a second monolithically integrated Group III nitride based transistor device that are coupled to form a half-bridge circuit and are arranged on a common substrate comprising a common doping level. The switching circuit is configured to operate the half-bridge circuit at a voltage of at least 300V. In some embodiments, the common substrate is a foreign substrate that is formed from a material other than Group III nitrides.

According to the invention, a multi-level gate driver for a Group III nitride-based enhancement mode transistor device comprising a source, a gate and a drain is provided. During an on-cycle of the Group III nitride-based enhancement mode transistor device the gate driver is configured to supply the gate with a first gate voltage during a first time period so that a first gate current $Ig_1$ is applied during the first time period that is sufficient to turn on the gate and maintain the gate in an on state, and supply the gate with a second gate voltage during a second time period subsequent to the first time period so that a second gate current $Ig_2$ is applied to the gate during the second time period to maintain the gate in an on state, wherein $Ig_1 > 5Ig_2$, or $Ig_1 > 10Ig_2$.

The first gate voltage is larger than the second gate voltage in order to achieve a first gate current $Ig_1$ that is larger than the second gate current $Ig_2$. The ratio between the first gate voltage and the second gate voltage may be the same or substantially similar to the desired ratio between the first gate current $Ig_1$ and the second gate current $Ig_2$.

According to the invention, a multi-level gate driver for a Group III nitride-based enhancement mode transistor device comprising a source, a gate and a drain is provided. During an on-cycle of the Group III nitride-based enhancement mode transistor device the gate driver is configured to supply the gate with a first gate current $Ig_1$ during a first time period, wherein $Ig_1$ is sufficient to turn on the gate and maintain the gate in an on state, and supply the gate with a second gate current $Ig_2$ during a second time period subsequent to the first time period, wherein $Ig_2$ maintains the gate in an on state, wherein $Ig_1 > 5Ig_2$, or $Ig_1 > 10Ig_2$.

The gate may be an Ohmic gate or a Schottky gate.

The alternative approaches for driving the gate, i.e. the gate driver is configured to either supply the gate with the desired gate current or supply a gate voltage suitable for producing the desired gate current, enable the Group III nitride-based enhancement mode transistor device to be operated at a voltage of at least 300V, enable a half bridge circuit including the Group III nitride-based enhancement mode transistor device as the high side switch of the half-bridge circuit to be operated at least 300V and enable a bidirectional switch including the Group III nitride-based enhancement mode transistor device as the high side switch of the half-bridge circuit to be operated at at least 300V.

For both alternative approaches for driving the gate, i.e. for the gate driver that is configured to supply the gate with the desired gate current or the gate driver that is configured to supply a gate voltage suitable for producing the desired gate current, the first and second gate currents $Ig_1$ and $Ig_2$ differ from an initial spike of a transient current, as can be observed during hard switching for example, since the first gate current is a steady state current that can be distinguished from a transient current.

The difference in the ratio of such a transient current and the subsequent steady state gate current is much smaller than the minimum difference between the first and second gate currents $Ig_1$ and $Ig_2$ of 5 used in the gate driver described herein. For example, the difference in the ratio between such a transient current and the subsequent steady state gate current is typically less than 2.

Furthermore, as the first gate current is a steady state current, the first gate current is applied during the first time period, whereby the first time period is greater than the time period of a transient current. The first time period is also greater than the initial time period over which a transient gate current is observed, for example the first time period lies in the range of 10 ns to 3 µs, or 50 ns to 3 µs, or, or 100 ns to 3 µs, or, or 500 ns to 3 µs, or 1 µs to 3 µs.

A Group III nitride-based enhancement mode transistor driven using the gate driver according to one of the embodiments described herein may also display such a transient current before the first steady state gate current $Ig_1$, the transient gate current having a greater value than the first gate current $Ig_1$.

In some embodiments, in which the gate driver supplies the gate with a gate voltage, in a further on-cycle of the Group III nitride-based enhancement mode transistor device the gate driver is configured to supply the gate with a single gate voltage during an entire time period of the on-cycle.

In some embodiments, in which the gate driver supplies the gate with a gate current, in a further on-cycle of the Group III nitride-based enhancement mode transistor device the gate driver is configured to supply the gate with a single gate current during an entire time period of the on-cycle.

Therefore, the gate driver may drive the gate during one or more subsequent on-cycles using a different driver scheme to one or more of the previous on-cycles. These embodiments may be used to take advantage of any so-called memory effects to simplify the driving scheme by, after using a multilevel scheme including two or more steady state gate voltage levels or gate current levels in a single on-cycle, using a single gate voltage level or gate current level used for one or more of the subsequent on-cycles.

In some embodiments, in which the gate driver supplies the gate with a gate voltage, the gate driver is further configured to supply a third gate voltage to switch off the gate.

In some embodiments, in which the gate driver supplies the gate with a gate current, the gate driver is further configured to supply a third gate current to switch off the gate.

In some embodiments, in which the gate driver supplies the gate with a gate voltage, the gate driver is further configured to supply a third gate voltage to switch off the gate, wherein the third gate voltage is 0.

In some embodiments, in which the gate driver supplies the gate with a gate voltage, the gate driver is further configured to supply a third gate voltage to switch off the gate, wherein the third gate voltage is negative, and followed by a fourth gate voltage that is around 0. This gate driver scheme may be used to ensure that the gate is switched completely off.

In some embodiments, in which the gate driver supplies the gate with a gate voltage, the gate driver is further configured to supply a third gate voltage to switch off the gate, followed by a fourth gate voltage, wherein the third gate voltage is negative and the fourth gate voltage is negative and greater than the third gate voltage. These gate driver schemes may be used to ensure that the gate is switched completely off.

In some embodiments, in which the gate driver supplies the gate with a gate voltage, the gate driver is further configured to apply a fifth gate voltage to the gate in an initial time period, prior to the first time period, so that an initial gate current $Ig_0$ is applied to turn on the gate and maintain the gate in an on state, wherein $Ig_0 < Ig_1$.

In some embodiments, in which the gate driver supplies the gate with a gate current, the gate driver is further configured to supply the gate with an initial gate current $Ig_0$ during an initial time period prior to the first time period to turn on the gate, wherein $Ig_0 < Ig_1$.

In these embodiments, the first gate current $Ig_1$ is sufficient to switch on the gate, but is not used to switch on the gate. Rather an initial gate current $Ig_0$ that is smaller than the first gate current $Ig_1$ is used to switch on the gate and maintain the gate in an on state and then afterwards the first gate current $Ig_1$ is applied to the gate.

In some embodiments, in which the gate driver supplies the gate with a gate voltage, the gate is supplied with the first gate voltage during the first time period so that the first gate current $Ig_1$ turns on the gate and maintain the gate in an on state. In some embodiments, in which the gate driver supplies the gate with a gate current, the gate is supplied with the first gate current $Ig_1$ during the first time period to turn on the gate and maintain the gate in an on state. In these embodiments, the first gate current $Ig_1$ is used to switch on the gate without applying a prior smaller gate current.

According to the invention, a power switching circuit is provided that comprises a Group III nitride-based semiconductor body comprising a first monolithically integrated Group III nitride-based enhancement mode transistor device and a second monolithically integrated Group III nitride-based enhancement mode transistor device. The power switching circuit also comprises a gate driver according to one of the embodiments described herein. The first monolithically integrated Group III nitride-based enhancement mode transistor device and the second monolithically integrated Group III nitride-based enhancement mode transistor device are coupled to form a circuit with a load path and are arranged on a common substrate.

By using the multi-level gate driving scheme according to one of the embodiments described herein, the power switching circuit can be operated at at least 300V.

In some embodiments, a drain of the first monolithically integrated Group III nitride-based enhancement mode transistor devices is coupled to a source of the second monolithically integrated Group III nitride-based enhancement mode transistor device to form a half-bridge circuit.

In some embodiments, a drain of the first monolithically integrated Group III nitride-based enhancement mode transistor device and a drain of the second monolithically integrated Group III nitride-based enhancement mode transistor device are coupled to form a bidirectional switch.

In some embodiments, the power switching circuit further comprises a diode comprising an anode and a cathode, wherein the anode is coupled to a node having the lowest potential and the cathode is coupled to the common substrate.

In some embodiments, the diode is integrated into the common substrate.

In some embodiments, the common substrate is a p-doped substrate and comprises a n-doped island on the p-doped substrate and a p-doped layer on the n-doped island to form the diode, the group III nitride semiconductor body being arranged on the p-doped layer.

In some embodiments, the p-doped layer is omitted so that the diode is formed from the p-doped substrate and the n-doped island on the p-doped substrate. The p-doped layer on the n-doped island can be used to improve performance.

In some embodiments, the common substrate is a p-doped substrate and comprises a n-doped well in the p-doped substrate and a p-doped layer arranged on n-doped well and on the p-doped substrate to form the diode, the p doped layer comprising trenches that completely interrupt the p-doped layer adjacent the n-doped well, the group III nitride semiconductor body being arranged on the p-doped layer.

In some embodiments, the p-doped layer can be omitted so that the diode is formed from the p-doped substrate and the n-doped well in the p-doped substrate.

In some embodiments, the common substrate is a p-doped substrate and comprises a n-doped well in the p-doped substrate, a p-doped well in n-doped well to form the diode and a p-doped ring arranged in p-doped substrate that is laterally spaced apart from the n-doped well, the group III nitride semiconductor body being arranged on the p-doped well.

In some embodiments, the p-doped well is omitted so that the common substrate is a p-doped substrate and comprises a n-doped well in the p-doped substrate to form the diode. A p-doped ring arranged in p-doped substrate that is laterally spaced apart from the n-doped well, the group III nitride semiconductor body being arranged on the n-doped well.

According to the invention, a method of switching a Group III nitride-based enhancement mode transistor device comprising a source, a gate and a drain is provided, the method comprising, during an on-cycle of the Group III nitride-based enhancement mode transistor device, supplying the gate with a first gate voltage during a first time period so that a first gate current $Ig_1$ is applied during the first time period that is sufficient to turn on the gate and maintain the gate in an on state, and supplying the gate with a second gate voltage during a second time period subsequent to the first time period so that a second gate current $Ig_2$ is applied to the gate during the second time period to maintain the gate in an on state, wherein $Ig_1 > 5Ig_2$, or $Ig_1 > 10Ig_2$.

According to the invention, a method of switching a Group III nitride-based enhancement mode transistor device comprising a source, a gate and a drain is provided, the method comprising, during an on-cycle of the Group III nitride-based enhancement mode transistor device, supplying the gate with a first gate current $Ig_1$ during a first time period that is sufficient to turn on the gate and maintain the gate in an on state, and supplying the gate with a second gate current $Ig_2$ during a second time period subsequent to the first time period to maintain the gate in an on state, wherein $Ig_1 > 5Ig_2$, or $Ig_1 > 10Ig_2$.

In some embodiments, in which the gate is supplied with gate voltages, in a further on-cycle of the Group III nitride-based enhancement mode transistor device the method comprises supplying the gate with a single gate voltage during an entire time period of the on-cycle.

In some embodiments, in which the gate is supplied with gate currents, in a further on-cycle of the Group III nitride-based enhancement mode transistor device the method comprises supplying the gate with a single gate current during an entire time period of the on-cycle.

In some embodiments, in which the gate is supplied with gate voltages, the gate is supplied with the first gate voltage during a first time period so that the first gate current $Ig_1$ turns on the gate and maintain the gate in an on state.

In some embodiments, in which the gate is supplied with gate currents, the gate is supplied with a first gate current $Ig_1$ during a first time period to turn on the gate and maintain the gate in an on state.

In some embodiments, in which the gate is supplied with gate voltages, the method further comprises applying a fifth gate voltage to the gate in an initial time period, prior to the first time period, so that an initial gate current $Ig_0$ is applied to turn on the gate and maintain the gate in an on state, wherein $Ig_0 < Ig_1$.

In some embodiments, in which the gate is supplied with gate currents, the method further comprises supplying the gate with an initial gate current $Ig_0$ during an initial time period prior to the first time period to turn on the gate and maintain the gate in an on state, wherein $Ig_0 < Ig_1$.

In some embodiments, the Group III nitride-based enhancement mode transistor device is a high side switch of a half-bridge circuit, wherein the half bridge circuit further comprises a further Group III nitride-based enhancement mode transistor device configured to provide a low side switch of the half-bridge circuit. The high side switch is driven by the method of any one of the embodiments described herein. The method further comprises during an on-cycle of the low side switch supplying a gate of the further Group III nitride-based enhancement mode transistor device with a single gate voltage or a single gate current.

The high side switch is, therefore, driven using two or more steady state levels, whereas the low side switch is driven using a single steady state level.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 3A illustrates a schematic diagram of a switching circuit according to an embodiment.

FIG. 3B illustrates a graph of $V_{SW}$ drop for VDC of 400V for a three-level driver.

FIG. 4A illustrates a diode structure according to an embodiment.

FIG. 5A illustrates a Group III nitride-based enhancement mode transistor device according to an embodiment.

FIG. 5B illustrates a graph of gate source voltage VGS against time for the high side switch (HSS) and the low side switch (LSS) and VSW of a half-bridge bridge circuit against time.

FIG. 5C illustrates a circuit diagram of the device of FIG. 5A during soft switching.

FIG. 5D illustrates a circuit diagram of the device of FIG. 5A during a first period of the on-state of the high side switch.

FIG. 5E illustrates a schematic diagram of the high side switch during a first period of the on-state of the high side switch.

DETAILED DESCRIPTION

Figure 1:
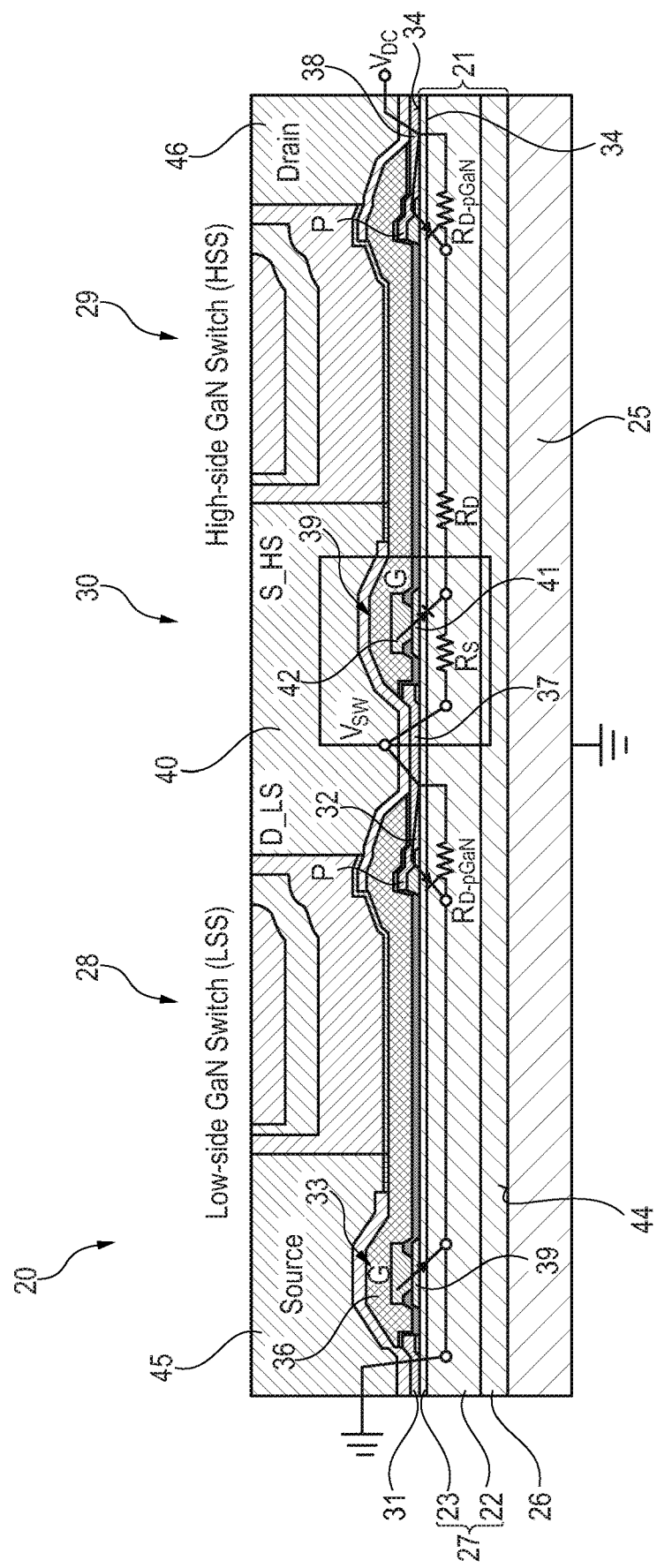
FIG. 1 illustrates a cross-sectional view of a semiconductor device according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention.

The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a normally-on transistor, has a negative threshold voltage which means that it can conduct current at zero gate voltage. These devices are normally on. An enhancement-mode device, such as a normally-off transistor, has a positive threshold voltage which means that it cannot conduct current at zero gate voltage and is normally off. The operation of both depletion-mode and enhancement-mode devices is not limited to high voltages and may also be low voltages.

As used herein, a "high-voltage device", such as a high-voltage transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where $0<x<1$.

Multiple GaN devices on a common Si substrate can be realized using laterally conducting device structures in GaN-on-Si technology, for example. However, monolithically integrated GaN devices on a common Si substrate for a Half-Bridge can suffer from instability of high-side switch (HSS) during switching beyond a certain DC Bus voltage, which may cause HSS failures. One explanation for this instability may be the capacitive effect of GaN based epi-layers in dynamic operation leading to depletion of the 2-dimensional electron gas (2DEG) forming the channel and an increase in Rdson. One approach to improve the stability is to include additional electrical isolation between the GaN devices and in the substrate at positions laterally between the GaN devices.

FIG. 1 illustrates a cross-sectional view of a semiconductor device 20 according to an embodiment. The semiconductor device 20 includes a III-V semiconductor body 21, into which multiple devices are monolithically integrated. The multiple devices are monolithically integrated into a III-V semiconductor body which is formed on a common substrate. The semiconductor devices may be switchable devices including a gate, such as a transistor device or a bidirectional switch which may include a single or multiple gates. Two transistor devices may be coupled to form a half-bridge configuration, for example. In some embodiments, the semiconductor body 21 may comprise a Group III nitride-based semiconductor body.

In the embodiment illustrated in FIG. 1, the semiconductor body 21 comprises a multilayer Group III nitride-based semiconductor structure including a channel layer 22 and a barrier layer 23 arranged on the channel layer 22 such that a heterojunction 24 is formed at the interface between the barrier layer 23 and the channel layer 22. The heterojunction 24 is capable of support a two-dimensional charge gas such as a two-dimensional electron gas (2DEG). The Group III nitride-based semiconductor body 21 in which the multiple Group III nitride-based devices are formed is arranged on a common substrate 25. The common substrate 25 includes an upper or growth surface 44 which is capable of supporting the epitaxial growth of one or more Group III nitride-base layers.

In some embodiments, the common substrate is a foreign substrate and formed of a material other than Group III nitride materials that includes an upper or growth surface 44 which is capable of supporting the epitaxial growth of one or more Group III nitride-base layers. The common foreign substrate 25 may be formed of silicon and may be formed of monocrystalline silicon or an epitaxial silicon layer, for example.

The Group III nitride-based semiconductor body 21 may include a transition or buffer structure 26 that is arranged between the common foreign substrate 25 and a Group III nitride-based device layer 27. In the illustrated embodiment, the Group III nitride-based device layer 27 includes the channel layer 22 and the barrier layer 23. The transition structure 26 may comprise one or more Group III nitrides and have a multilayer structure.

In some non-illustrated embodiments, the Group III nitride-based semiconductor body 21 may further include a back barrier layer. The channel layer 22 is formed on the back barrier layer and forms a heterojunction with the back barrier layer and the barrier layer 23 is formed on channel layer 22. The back barrier layer has a different bandgap to the channel layer and may comprise AlGaN, for example.

The composition of the AlGaN of the back barrier layer may differ from the composition of the AlGaN used for the barrier layer 23.

A typical transition or buffer structure 26 for a silicon substrate includes a AlN starting layer, which may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer or AlGaN back barrier, if present, is grown. Alternatively, a superlattice buffer can be used. Again, an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 2-25 nm. Depending on the desired breakdown voltage the superlattice may include between 20 and 100 pairs. Alternatively, an $Al_xGa_{(1-x)}N$ layer sequence as described above can be used in combination with the above mentioned superlattice.

In the embodiment illustrated in FIG. 1, the semiconductor device 20 includes two transistor devices 28, 29 that are monolithically integrated in the semiconductor body 21. In some embodiments, the first monolithically integrated device 28 is a switchable device including a gate and may include a Group III nitride-based transistor device. The first monolithically integrated transistor device 28 may be an enhancement mode device, which is normally off. In other non-illustrated embodiments, the first monolithically integrated transistor device 28 may be a depletion mode device, which is normally on. The second monolithically integrated device 29 is also a switchable device including a gate and may include a Group III nitride-based transistor device. The second monolithically integrated Group III nitride-based semiconductor device 29 may be an enhancement mode device, as illustrated in FIG. 1, or a depletion mode device. The first and second monolithically integrated transistor devices 28, 29 may be HEMTs (High Electron Mobility Transistors).

In some embodiments, the two monolithically integrated semiconductor devices 28, 29 may be coupled to form half bridge circuit 30, as in the embodiment illustrated in FIG. 1. In other embodiments, the two monolithically integrated semiconductor devices 28, 29 may be coupled to form, or be configured as, a bidirectional switch.

The first monolithically integrated Group III nitride-based transistor device 28 provides the low side switch (LSS) of the half bridge circuit 30 and includes a source 31, a drain 32 and a gate 33 arranged on a first major surface 34 of the semiconductor body 21. The gate 33 is arranged laterally between the source 31 and the drain 32. In this illustrated embodiment, the gate 33 includes a p doped Group III nitride region 35 positioned between a metal gate 36 and the barrier layer 23 such that the first monolithically integrated Group III nitride-based transistor device 28 is an enhancement mode device. The gate 33 may be an ohmic gate or a Schottky gate. The gate 33 may have a recessed gate structure.

The second monolithically integrated Group III nitride-based-based transistor device 29 provides the high side switch (HSS) of the half bridge circuit 30 and includes a source 37, a drain 38 and a gate 39 arranged on the first major surface 34 of the semiconductor body 21. The gate 39 is arranged laterally between the source 37 and the drain 38 and, in the illustrated embodiment, also includes a p-doped region 41 positioned between a metal gate 42 and the barrier layer 23 so that the second monolithically integrated Group III nitride-based transistor device 29 is also an enhancement mode device. The gate 33 may be an ohmic gate or a Schottky gate. The gate 33 may have a recessed gate structure.

The second monolithically integrated Group III nitride-based-based transistor device 29 is arranged laterally adjacent to the first monolithically integrated Group III nitride-based transistor device 28 such that a single conductive region 40 extends between the source 37 of the second monolithically integrated Group III nitride-based transistor device 29 and the drain 32 of the first monolithically integrated Group III nitride-based transistor device 28 and provides the output node of the half bridge circuit 30. The semiconductor device 20 also includes a source electrode 45 that is coupled to the source 37 of the first monolithically integrated Group III nitride-based-based transistor device 28 and a drain electrode 46 that is coupled to the drain 38 of the second monolithically integrated Group III nitride-based-based transistor device 29.

Both of these Group III nitride-based semiconductor devices 28, 29 are monolithically integrated in a common Group III nitride-based semiconductor body 21 which is positioned on a common foreign substrate 25. In the embodiments described herein, no electrical insulation is provided between the two Group III nitride-based semiconductor devices 28, 29, for example no isolation trenches are positioned in the semiconductor body 21 between the devices 28, 29. Additionally, no electrical insulation is provided in the common foreign substrate 25, e.g. trenches or doped regions, between the positions of the two semiconductor devices 28, 29 and no discrete doped regions are provided in the substrate 25. The common foreign substrate 25 extends continuously and uninterruptedly under the devices 28, 29 that are monolithically integrated into a single common semiconductor body 21 such that the potential of the common foreign substrate 25 is the same throughout its area. The common foreign substrate 25 may also have a common doping level.

Monolithically integrated III-V devices on a common foreign substrate can suffer from instability. As discussed above, monolithically integrated GaN devices on a common Si substrate forming a Half-Bridge circuit can suffer from instability of high-side switch during switching beyond a critical DC Bus voltage. Conventional monolithically integrated GaN half-bridges can fail at DC link voltage of around 250V when operated with a conventional gate driver.

According to embodiments described herein, multiple Group III nitride-based devices, such as GaN FETs, that are monolithically integrated on a common Si substrate are driven by a multiple-level (three or more levels) gate driver so as to allow operation beyond 300V and even beyond 600V with no difficulty. Furthermore, monolithic integration of a GaN Half-bridge circuit on a single chip with reliable operation beyond 600V can be realized which also has a small footprint and low-cost benefits and can be used in applications such as power factor correction and motor drive. Additionally, there are chip-level benefits including cost reduction by reducing die area and the entire chip size, and the benefit in the application system with higher efficiency thanks to realization of minimal parasitic inductance.

The multiple level gate driver may also be used to drive III-V devices, including III-V devices that are monolithically integrated on a common substrate, and devices other than transistor devices, for example III-V bidirectional devices and GaN bidirectional devices.

The multiple level gate driver may also be used to drive a single III-V semiconductor device, for example a single Group III nitride transistor device such as a single HEMT that is not monolithically integrated with other devices. The multiple level gate driver and method of driving the gate using multiple levels according to any one of the embodiments described herein can have a positive effect on and assist in mitigating dynamic effects such as dynamic $R_{DSon}$ in a single III-V semiconductor device.

According to embodiments described herein, a gate driver is provided that is used to drive the gate by applying multiple gate voltage levels or multiple gate current levels to the gate during the on period of the switch, i.e. transistor device. The multiple gate voltage levels or gate current levels may be applied to the gate of the high side switch of a half bridge circuit. Surprisingly, this enables the monolithically integrated Group III nitride half-bridge to operate beyond 600V with no difficulty whilst driving the monolithically integrated Group III nitride half-bridge with a conventional two-level driving scheme can be observed to lead to the failure of the device even at DC link voltage of ~250V.

The proposed three or more level gate driving scheme is thought to supply a sufficiently large number of holes from the gate to the channel when the high side switch (HSS) turns on to prevent 2DEG depletion when the HSS is on. A sufficiently large number of holes is supplied from the gate to the channel in a controlled way. These holes compensate the negative effect on capacitive action of the GaN epi structure as a capacitor. The GaN capacitor will be charged when HSS is on.

One explanation for the observed increase in the operating voltage is that the top of epi region, which is GaN channel, will be positively charged while the bottom of the epi region, which is Si substrate, will be negatively charged. When it is said that the GaN channel is positively charged, the channel will lose 2DEG without any hole supply to keep the charge neutrality. Thus, one explanation is that the multi-level gate driving method feeds a sufficient number of holes to the channel to make the channel positively charged and at the same time keep 2DEG and its good conductivity.

In order to reduce the capacitive effect of the Group III nitride epitaxial layers, embodiments aim to reduce the effective voltage difference between the top channel, i.e. the two dimensional charge gas of the transistor, in particular of the high side switch of the monolithically integrated half bridge circuit, and the bottom Si substrate leading to a mitigated capacitive effect.

In further embodiments, in addition to or in place of the multiple level gate driver with a minimum of three levels, a substrate diode and/or p-doped GaN region coupled to source may be used.

A diode formed Si substrate before GaN epi-growth may be used to provide additional voltage drop so that the actual voltage drop across the GaN epi capacitor is reduced. The addition of source coupled p-GaN region is thought to act in a similar manner to a p-GaN region coupled to drain to provide additional holes during soft switching.

One possible explanation for the observed effect of the source-coupled p-doped Group III nitride region is that, when low-side switch (LSS) turns off and HSS turns on in case of soft switching, the source-coupled p-GaN region can turn on since a sufficiently large current flows from source toward drain during the switching and first half of HSS turn-on period. This is the same principle as in drain-coupled pGaN region where the current direction is from drain toward gate during the hard switching. Once the source-coupled p-GaN region turns on, holes are injected into the channel from the source towards gate. Therefore, the intrinsic GaN capacitor will be charged when HSS is on. For example, the top of epi region, which is GaN channel, will be positively charged while the bottom of the epi region, which is Si substrate, will be negatively charged. When it is said that the GaN channel is positively charged, the channel will lose 2DEG without any hole supply to keep the charge neutrality. Thus, the integrated substrate diode will suppress 2DEG depletion and the integrated source-pGaN will feed a sufficient number of holes to the channel. Consequently, the monolithically integrated GaN half-bridge works well at 600V or above.

The arrangement illustrated in FIG. 1 can suffer from the effect that the drain source current of the high side switch 29 is in practice less than expected. One explanation for this observation is that a parasitic resistance, denoted in FIG. 1 as Rs, in the high side switch 29 occurs between the source 32 and the gate 39 of the high side switch when the high side switch 29 changes from an off state to an on state. This parasitic resistance Rs may increase due to the capacitive effect of the Group III nitride-based epitaxial structure of the semiconductor body 21 which effectively acts as a capacitor in which the two-dimensional electron gas forms the top electrode, the substrate 25 forms the bottom electrode and the Group III nitride-based epitaxial structure between the two dimensional electron gas and the substrate 25 forms the dielectric of the capacitor structure. As the high side switch 29 is switched on, the top electrode of this parasitic capacitor is positively charged by depleting the two-dimensional electron gas, thus increasing the parasitic resistance Rs. The intrinsic gate voltage gate source voltage, VGS, becomes small so that ID become small and the drain source voltage, $V_{DS}$ increases. In other words, the switching voltage $V_{SW}$ decreases and the high side switch 29 could fail due to thermal runaway. The parasitic resistance RD between the gate and drain is also increased but this is mitigated in the design illustrated in FIG. 1 by the presence of the p-doped region 43 which is coupled to drain and injects holes.

As a consequence of this capacitive effect, $$V_{GSintrinsic}=V_{GS}-I_{DS}\times Rs<V_{GSextrinsic}$$

and the actual drain source current Ids of the high side switch 29 is smaller than expected.

Surprisingly, the inventors have discovered that this problem can be overcome by a particular method of driving the gate of the high side switch of a monolithically integrated Group III nitride-based half bridge circuit using three or more levels including two or more levels in the on state.

Figure 2A:
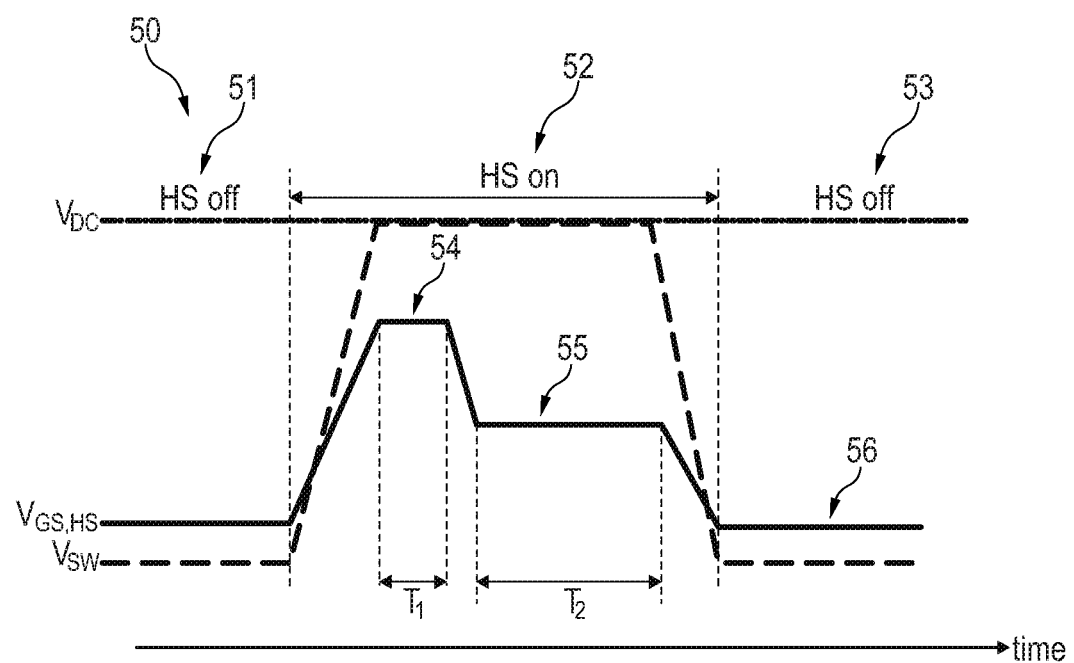
FIG. 2A illustrates a diagram of voltage waveforms applied to the gate of the high side switch of a monolithically integrated half-bridge circuit according to various embodiments.

FIG. 2A illustrates a diagram 50 of the voltage waveforms VGS applied to the gate of the high side switch of a monolithically integrated half-bridge circuit, for example, the second monolithically integrated Group III nitride-based transistor device 29 of the semiconductor device 20 illustrated in FIG. 1.

FIG. 2A illustrates a diagram 50 of the on cycle of the Group III nitride-based transistor device in which the high side switch is first off, period 51, is switched on, period 52, and is then switched off again, period 53. As is illustrated in FIG. 2A, a multi-level gate driver concept is used which includes three or more levels. During the on cycle 52, the gate of the high side switch is supplied with a first gate voltage $V_{GS}$ indicated by the level 54 in FIG. 2A for a predetermined time period $T_1$ such that a first gate current $I_{G1}$ is applied to turn on the gate. A second gate voltage having a level 55 is applied to the gate of the high side switch during a second time period $T_2$ of the on cycle 52, which is subsequent to the first time period $T_1$, so that a second gate current $I_{G2}$ is applied to the gate to maintain the gate in an on state. The second gate voltage 55 is less than the first gate voltage 54. The second time period $T_2$ may be contiguous to the first time period $T_1$. The first gate current $I_{G1}$ is at least 5 times greater than the second gate current $I_{G2}$ or greater than 10 times $I_{G2}$. For example, in some embodiments, $I_{G1}$ can lie in the range of 1.68 µA/µm² to 4.81 µA/µm² and $I_{G2}$ lie in the range of 48.1 nA/µm² to 0.24 µA/µm². In some embodiments, the first period $T_1$ may be around 300 ns. After expiry of the time period $T_2$, the gate is supplied with a voltage at a third level 56, which in this embodiment is zero or negative voltage, and the high side switch is switched off in period 53. Thus, the gate driver scheme 50 illustrated in FIG. 2A includes three levels, as two gate levels are using during the on cycle 52 and subsequent to the second time period $T_2$, the gate voltage or current supplied to the gate of the high side switch in a third level makes it off-state.

The signal applied to the gate may be the gate voltage or it may be a gate current. In both cases, the first gate voltage or first gate current applied to the gate during the first time period $T_1$ is such that the first gate current $I_{G1}$ is at least 5 times greater than the gate current Ice applied during the second period $T_2$ when a second gate voltage or second gate current is applied to the gate of the high side switch.

For both alternative approaches for driving the gate, i.e. for the gate driver that is configured to supply the gate with the desired gate current or the gate driver that is configured to supply a gate voltage suitable for producing the desired gate current, the first and second gate currents $Ig_1$ and $Ig_2$ differ from an initial spike of a transient current, as can be observed during hard switching using a single gate voltage or singly gate current during the on-cycle for example, since the first and second gate currents $Ig_1$ and $Ig_2$ are each a steady state current that can be distinguished from a transient current.

The difference in the ratio of such a transient current and a subsequent steady state gate current is much smaller than the minimum difference between the first and second gate currents $Ig_1$ and $Ig_2$ of 5 used in the gate driver described herein. For example, the difference in the ratio between such a transient current and the subsequent steady state gate current that observed in a conventional gate driving scheme supplying a single gate voltage or single gate current over the on-cycle is typically less than 2.

Furthermore, as the first gate current $Ig_1$ is a steady state current, the first gate current $Ig_1$ is applied during the first time period $T_1$ that is greater than the time period of a transient current. The first time period $T_1$ is also greater than the initial time period over which a transient gate current is observed in a conventional gate driving scheme supplying a single gate voltage or single gate current over the on-cycle, for example the first time period lies in the range of 10 ns to 3 µs, or 50 ns to 3 µs, or, or 100 ns to 3 µs, or, or 500 ns to 3 µs, or 1 µs to 3 µs.

In the gate driving scheme illustrated in FIG. 2A, the gate driver supplies two levels of Vas during the on period of the high side switch and one level during the off period of the high side switch. In other embodiments, the gate driver supplies two levels of Vas during the on period of the high side switch and two levels during the off period of the high side switch, e.g. to switch of the high side switch, the gate driver can supply a negative level followed by a level of zero.

In some embodiments, the gate driver is configured to apply three or more levels during the on period and one or more level during the off period.

In the embodiment illustrated in FIG. 2A, the gate is supplied with the first gate voltage during the first time period $T_1$ so that the first gate current $Ig_1$ turns on the gate and maintain the gate in an on state, or the gate may be supplied with a first gate current $Ig_1$ during the first time period $T_1$ to turn on the gate and maintain the gate in an on state.

In some embodiments, the gate current $I_{G1}$ is not used to switch on the gate, but is still high enough to be sufficient to switch on the gate. In some embodiments, an initial gate voltage is applied to the gate in an initial time period $T_0$, prior to the first time period $T_1$, so that an initial gate current $Ig_0$ is applied to turn on the gate and maintain the gate in an on state, wherein $Ig_0 < Ig_1$. Then, subsequently the gate voltage is applied to the gate to produce the gate current $I_{g1}$ in the first time period $T_1$ which is at least 5 times greater than the gate current $I_{g2}$ used in the second time period $T_2$.

In some embodiments, the gate is supplied with an initial gate current $Ig_0$ during an initial time period $T_0$ prior to the first time period $T_1$ to turn on the gate and maintain the gate in an on state, wherein $Ig_0 < Ig_1$. Then, subsequently, the gate current $I_{g1}$ is applied in the first time period $T_1$ which is at least 5 times greater than the gate current $I_{g2}$ applied in the subsequent second time period $T_2$.

One possible explanation of the effects of this gate driver scheme with three or more levels may be as follows.

As a result of the initial use of a higher gate source current $I_{GS1}$, additional holes are injected from the p-doped region 35 of the gate 33 which are sufficient to prevent depletion of the two-dimensional electron gas and keep good conductivity within the channel. As a result, the increase of the parasitic resistance RS between the source and the gate is suppressed and the intrinsic gate source voltage $V_{GS}$ of the high side switch is similar to the applied extrinsic voltage gate source voltage of the high side switch so that the drain source current Ins of the high side switch is not degraded. Consequently, the total RDSon of the high side switch remains at the expected level and $V_{SW}$ and $V_{DS}$ of the high side switch are not affected. As a consequence, the monolithically integrated Group III nitride-based half bridge circuit works well at higher voltages, for example voltages of 400V and above.

Figure 2B:
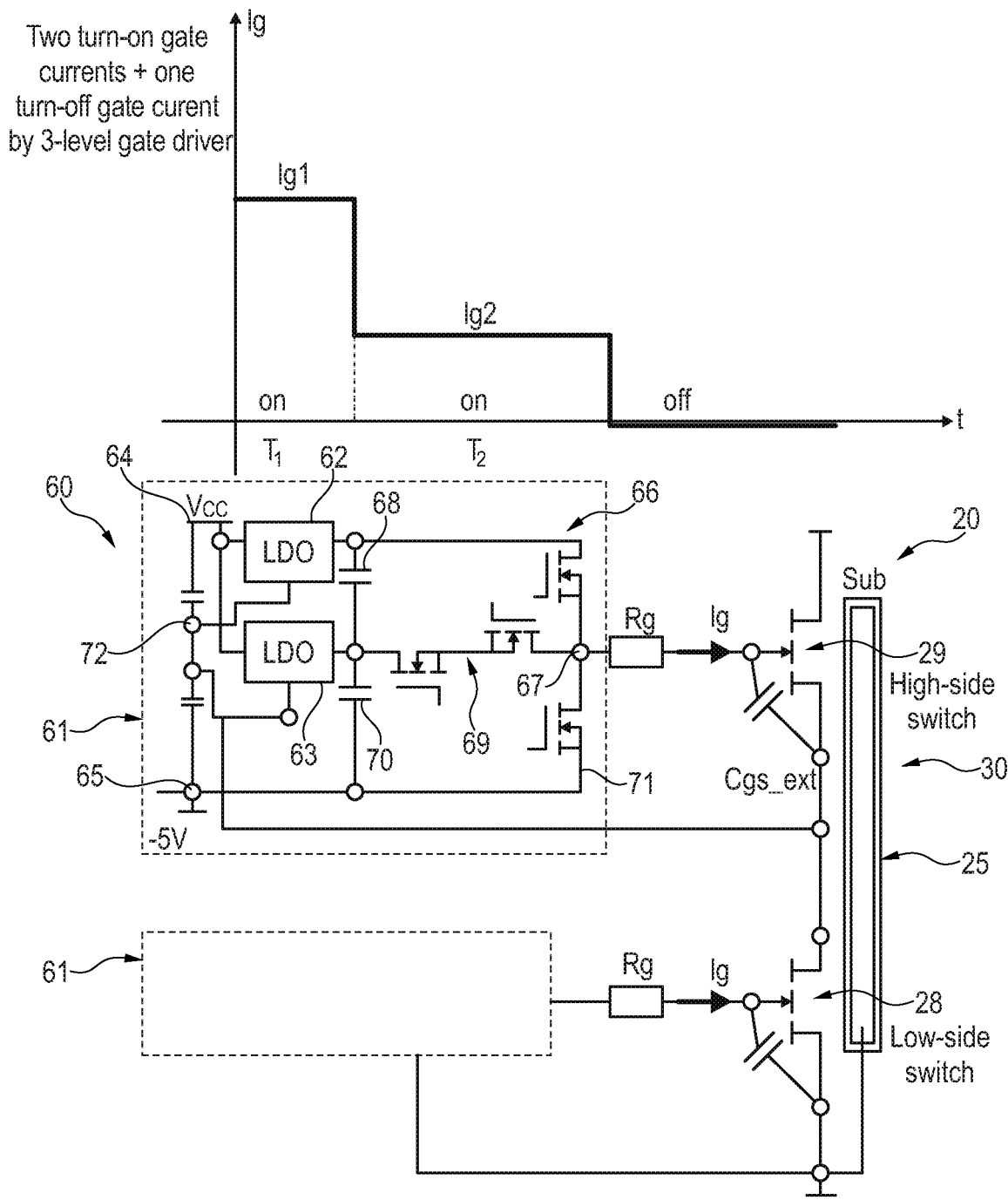
FIG. 2B illustrates a power switching circuit with a three level gate driver according to an embodiment.

FIG. 2B illustrates an example of a power switching circuit 60 including a gate driver 61 and the semiconductor device 20 comprising the monolithically integrated Group III nitride-based half bridge circuit 30 including the low side switch 28 and the high side switch 29 arranged in the common Group III nitride-based semiconductor body 21 on the common foreign substrate 25. In this embodiment, the common foreign substrate 25 is a common silicon substrate coupled to ground potential.

As is illustrated in FIG. 2B, the current supplied to the gate of the high side switch 29 has three levels, a first level $I_{G1}$ during a first time period $T_1$, a second level $I_{G2}$, which is less than the first level $I_{G1}$, during a second time period $T_2$ and a third level, which in this embodiment is zero or negligible, during third time period $T_3$ subsequent to the second time period $T_2$. The first and second time periods $T_1$ and $T_2$ are during the on period of the high side switch 29 and the third period $T_3$ is equal to the off period of the high side switch 29 so that the gate driver 61 supplies two on levels and one off level.

FIG. 2B also illustrates an exemplary gate driver 61 for providing this three-level supply to the gate of the high side switch 29. In the embodiment illustrated in FIG. 2B, the same three level gate driver may be used to drive the gate of the low side switch 28. However, the low side switch 28 may be driven by a two level gate driver or a three level gate driver having a different circuit to that illustrated for the high side switch 29.

The gate driver 61 for the high side switch 29 comprises a first linear voltage regulator (LDO) 62 and a second LDO 63. The first low-dropout (LDO) regulator 62 is electrically coupled between a high-voltage node 64 and a mid-node 72. The first LDO 62 is electrically coupled in parallel with the second LDO 63 that is also coupled between the high-voltage node 64 and a mid-node 72. The output of the first LDO 62 is coupled in series with a switch 66, for example a transistor device, that is coupled to the output node 67 of the gate driver circuit 61. The output of the first LDO 62 is also coupled to a capacitor 68 which is coupled to the output of the second LDO 63. The output of the second LDO 63 is also coupled to a bidirectional switch 69 that is coupled to the output node 67. A second capacitor 70 is electrically coupled between the output of the second LDO 63 and the low-voltage node 65. A transistor 71 is electrically coupled between the low-voltage node 65 and the output node 67.

When the switch 66 is switched on, a high voltage is applied to the output node 67 with which the first gate voltage $I_{G1}$ is supplied to the gate of the high side switch 29. When the bidirectional switch 69 is switched on, a low voltage is supplied to the output node 67 such that the lower current $I_{G2}$ is supplied to the gate of the high side switch 29. When both the switch 66 and bidirectional switch 69 are switched off and the switch 71 is switched on, a low voltage (i.e., 0V or −4V) is applied to the output node 67 and the high side switch 29 is switched off.

Figure 2D:
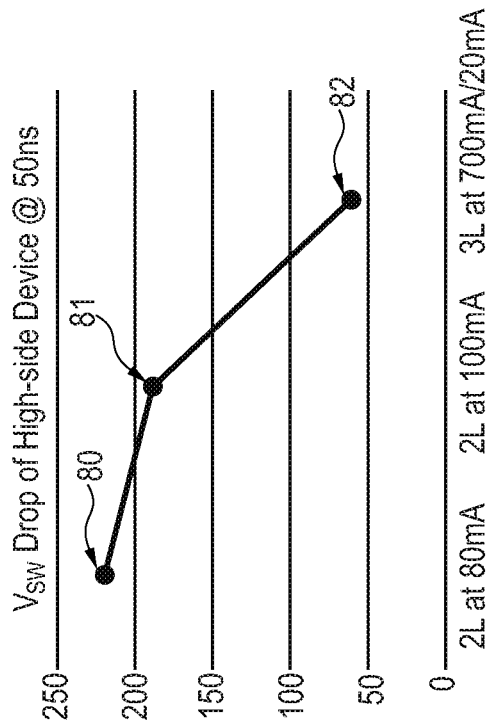
FIG. 2D illustrates a graph of $V_{SW}$ drop of the high side switch.
Figure 2F:
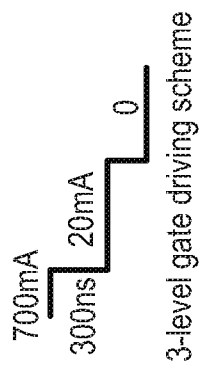
FIG. 2F illustrates a three level gate driving scheme according to an embodiment.
Figure 2C:
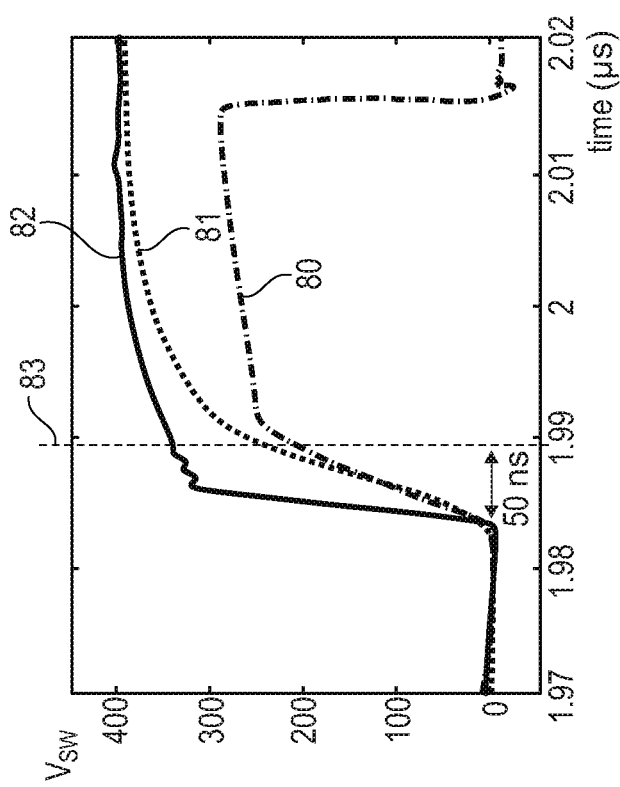
FIG. 2C illustrates a graph of switch node voltage, $V_{SW}$, as a function of time for three gate driving schemes.

FIG. 2C illustrates a graph of switch node voltage, $V_{SW}$, as a function of time for three gate driving schemes 80, 81 and 82. The voltage $V_{DC}$ is 400V in this embodiment. FIG. 2D illustrates a graph of the decrease of the actual $V_{SW}$ compared to the desired $V_{SW}$, or $V_{SW}$ drop, of the high side switch after a time period of 50 ns for the gate driving schemes 80, 81, 82.

Figure 2E:
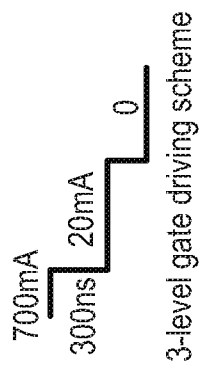
FIG. 2E illustrates a two level gate driving scheme according to two embodiments.

FIG. 2E illustrates a two level gate driving scheme in which the gate current during the on period is held at a single level of 80 mA or 100 mA corresponding to the schemes 80 and 81, respectively, in the of the graphs illustrated in FIGS. 2C and 2D.

FIG. 2F illustrates a three-level gate driving scheme corresponding to the scheme 82 in which during first period of 300 ns, a gate current of 700 mA is applied, during a second time period subsequent to the first time period gate, a current of 20 mA is applied followed by, during the off period, a current of zero.

After the period of 50 ns indicated in the graph of FIG. 2C by the dashed line 83, FIG. 2D illustrates that, for two level gate driving scheme, a voltage drop of $V_{SW}$ compared to 400V for a gate driver current of 80 mA (scheme 80) is greater than 200V and for a gate driver current of 100 mA (scheme 81) the drop is between 200 and 150. For the three-level gate driving scheme 82, using an initial gate current of 700 mA for the time period of 300 ns, and a subsequent gate current of 20 mA the drop in $V_{SW}$ after 50 ns compared to the desired value of 400V has been reduced to just over 50.

Figure 2G:
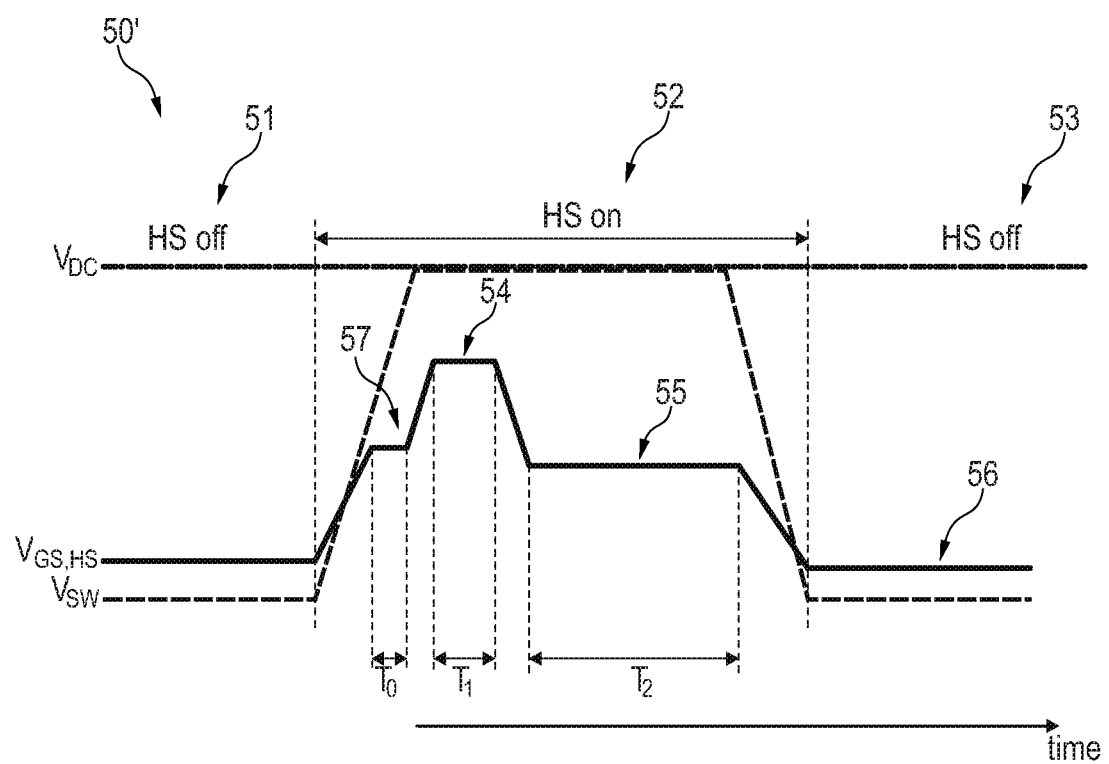
FIG. 2G illustrates a four level gate driving scheme according to an embodiment.

FIG. 2G illustrates a four level gate driving scheme 50' for the gate of the high side switch of a monolithically integrated half-bridge circuit according to an embodiment, for example, the second monolithically integrated Group III nitride-based transistor device 29 of the semiconductor device 20 illustrated in FIG. 1.

In the gate driving scheme 50' illustrated in FIG. 2G, is similar to the scheme 50 illustrated in FIG. 2A. However, in the scheme 50' illustrated in FIG. 2G, the gate driver supplies three levels of the gate voltage $V_{GS}$ during the on period 52 of the high side switch and one level during the off period 53 of the high side switch.

During the on cycle 52, the gate of the high side switch is supplied with an initial gate voltage indicated by the level 57 in FIG. 2G for a predetermined initial time period $T_0$, prior to the time period $T_1$, such that an initial gate source current Iso is applied to turn on the gate. The first gate voltage indicated by the level 54 in FIG. 2G is then applied subsequently to the initial gate current $I_{G0}$ for a predetermined time period $T_1$ such that a first gate current $I_{G1}$ is applied to the gate. The first gate current $I_{G1}$ is greater than the initial gate current $I_{G0}$. Similar to the embodiment illustrated in FIG. 2A, a second gate voltage having a level 55 is applied to the gate of the high side switch during a second time period $T_2$ of the on cycle 52, which is subsequent to the first time period $T_1$, so that a second gate current $I_{G2}$ is applied to the gate to maintain the gate in an on state. The second gate voltage 55 is less than the first gate voltage 54. The second time period $T_2$ may be contiguous to the first time period $T_1$. The first gate current $I_{G1}$ is at least 5 times greater than the second gate current $I_{G2}$ or greater than 10 times $I_{G2}$. For example, in some embodiments, $I_{G1}$ can lie in the range of 1.68 µA/µm² to 4.81 µA/µm² and $I_{G2}$ lie in the range of 48.1 nA/µm² to 0.24 µA/µm². After expiry of the time period $T_2$, the gate is supplied with a voltage at a third level 56, which in this embodiment is zero or negative voltage, and the high side switch is switched off in period 53.

Thus, the gate driver scheme 50 illustrated in FIG. 2G includes four levels, as three gate levels 57, 54, 55 are used during the on cycle 52 and a fourth level is used to switch off the gate. The signal applied to the gate may be the gate voltage or it may be a gate current. In both cases, the first gate voltage or first gate current applied to the gate during the first time period $T_1$ is such that the first gate current $I_{G1}$ is at least 5 times greater than the second current $I_{G2}$ applied during the second period $T_2$ when a second gate voltage or second gate current is applied to the gate of the high side switch.

The multiple gate current or gate voltage levels used in the on-cycle may be used in all of the on-cycles when operating the transistor or one or more switches of a switching circuit.

However, in some embodiments, in a further on-cycle, the gate driver is configured to supply the gate with a single gate voltage during an entire time period of the further on-cycle, or to supply the gate with a single gate current during an entire time period of the further on-cycle. This embodiment may be used if the switch, switches or circuit displays a so called memory effect in which after being driven using two or more gate levels in one or more on-cycles, the expected drain source current is obtained in one or more subsequent on-cycles when these are driven using a single gate level for the entire duration of the subsequent on-cycle(s). This embodiment can be used to reduce power consumption by the gate driver.

A method of switching a Group III nitride-based enhancement mode transistor device comprising a source, a gate and a drain using the embodiments described herein with reference to the gate driver and semiconductor device according to any one of the embodiments described herein is also provided.

FIG. 3A illustrates a schematic diagram of a switching circuit 60' including a three-level gate driver 61 for the high side switch and a three-level gate driver 61 for the low side switch of the half bridge circuit 30 provided by the semiconductor device 20. The switching circuit 60' includes an additional diode 84 coupled between the common foreign substrate 25 and ground. The anode of the diode 84 is coupled to the source of the low side switch 28 and the cathode is coupled to the common foreign substrate 25.

FIG. 3B illustrates a graph of $V_{SW}$ drop for VDC of 400V for the three-level driver 61 of FIG. 2C driving the semiconductor device 20 including the diode 84 that is shown in FIG. 3B by the scheme 85. For comparison the values of VSW for the schemes 80, 81 and 82 shown in FIG. 2C are also shown in FIG. 3B.

As can be seen in FIG. 3B, a further improvement is achieved by scheme 85 in the drop of the $V_{SW}$ of the high side switch 29 at a time period of 50 ns over the scheme 82 for the three level driver but no diode in that there is effectively no $V_{SW}$ drop, consequently, a decrease in RDSon is avoided.

Figure 3D:
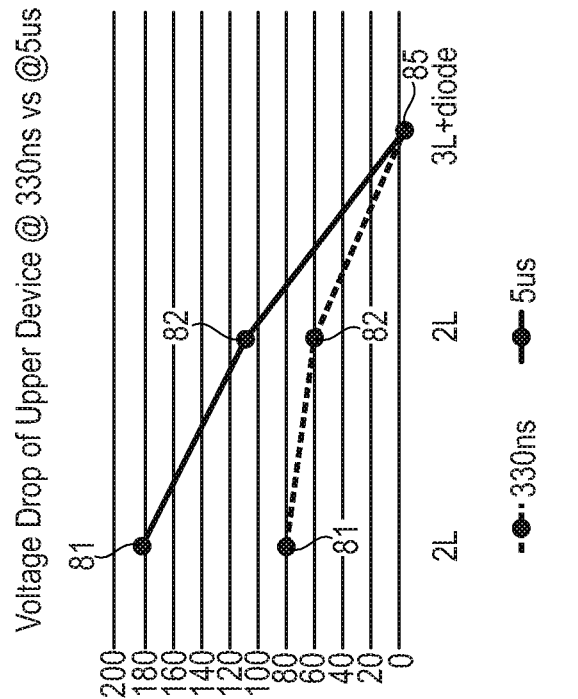
FIG. 3D illustrates a graph of Vds of high-side switch at three different gate driving schemes.
Figure 3C:
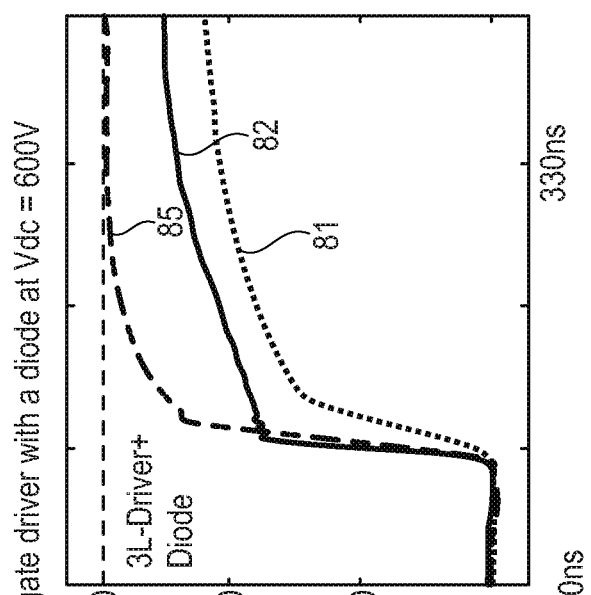
FIG. 3C illustrates a graph of $V_{SW}$ drop for VDC of 600V for a three-level driver.

FIG. 3C illustrates a further embodiment comparing the two-level driver, scheme 81, with the three-level driver, scheme 82, and the combination of the three-level driver and diode of scheme 85 for VDC 600 V.

FIG. 3D illustrates the voltage drop of $V_{SW}$ for the high side switch 29 after a period of 330 ns and 5 µs for the two-level driver, scheme 81, the three-level driver without a diode, scheme 82, and the three-level driver with the diode, scheme 85. FIG. 3D shows that the three-level driver circuit in combination with diode, scheme 85, results in a minimal loss after both 330 ns and 5 µs. The voltage drop seen when using the three level driver alone, scheme 82, at 330 ns and 5 µs is larger than for the embodiment with the three-level driver and the diode, scheme 85, but significantly less than when using the two level gate driver, scheme 81. This illustrates that switching circuit with the three-level driver including a diode coupled between the foreign common substrate and ground can be also used to achieve switching at $V_{dc}$ of 600V or above.

The diode 84 may be provided as a separate discrete component or as part of the semiconductor device 20.

In some embodiments, the semiconductor device according to any of the embodiments described herein further includes a diode structure, which is electrically coupled between the substrate and ground to form the diode 84 and the circuit illustrated in FIG. 3A. The diode structure may be integrated into the common foreign substrate 25. If the common foreign substrate 25 is formed of silicon, for example of a monocrystalline silicon wafer or an epitaxial silicon layer, the diode structure may be formed by forming one or more n-doped regions and one or more p-doped regions in the substrate 25. The diode structure may have various structures of which three possible structures are illustrated in FIGS. 4A to 4C.

Figure 4B:
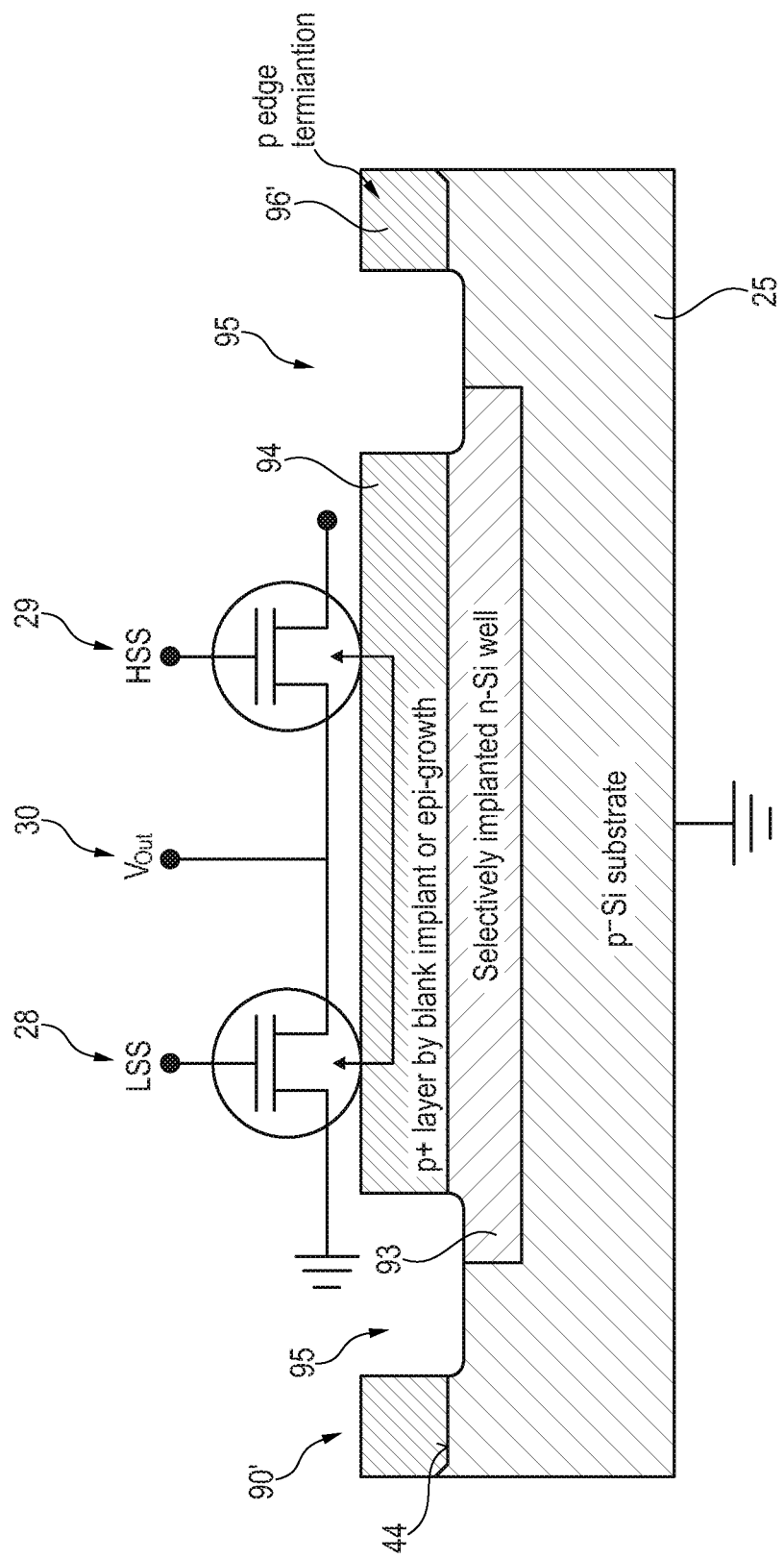
FIG. 4B illustrates a diode structure according to an embodiment.
Figure 4C:
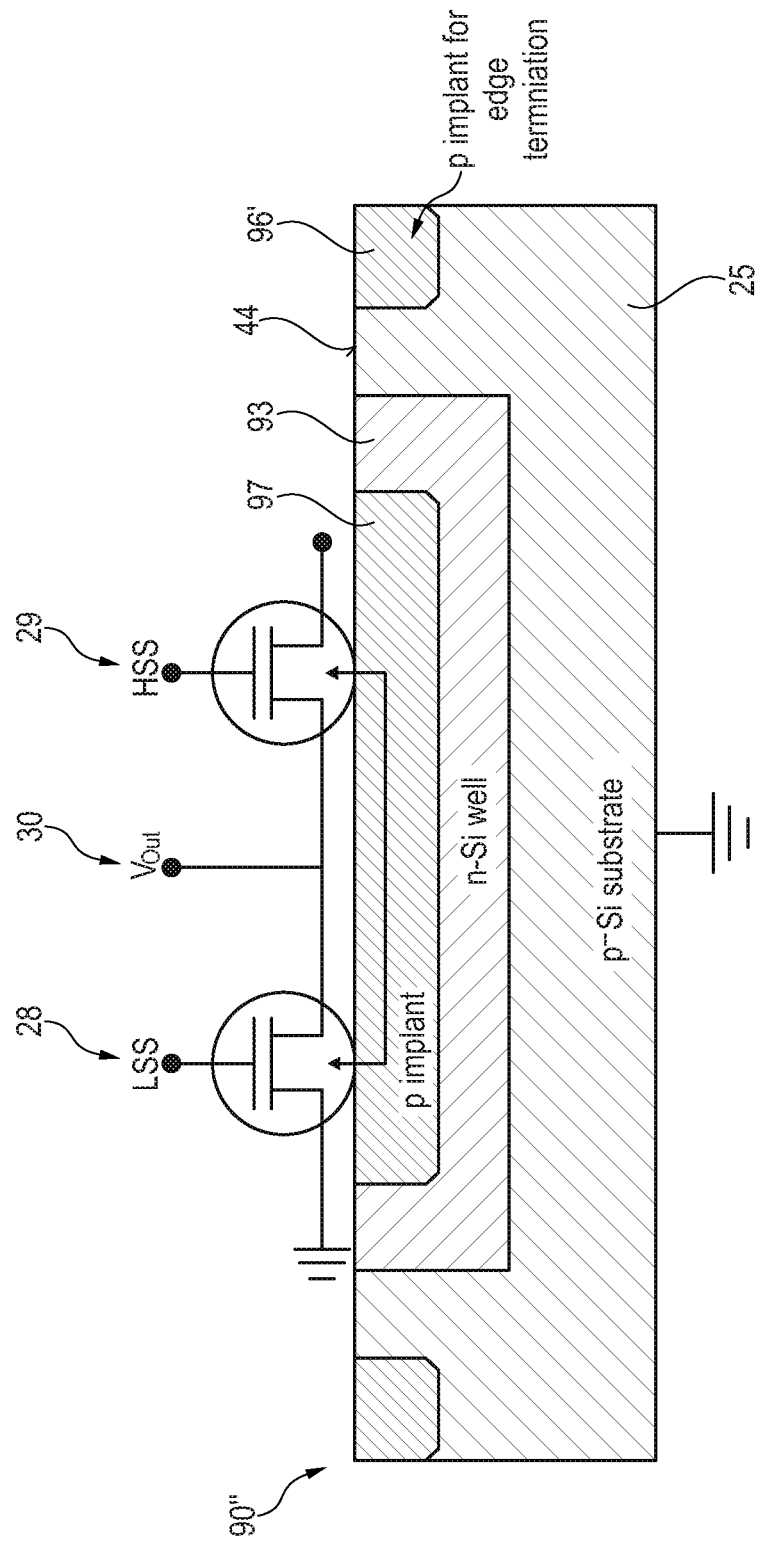
FIG. 4C illustrates a diode structure according to an embodiment.

In FIGS. 4A to 4C, the half bridge circuit 30 provided by the low side switch 28 and high side switch 29 monolithically integrated in the semiconductor body is illustrated schematically by a circuit diagram. The semiconductor body, in which both the low side switch 28 and high side switch 29 are monolithically integrated, may be formed directly on top of the diode structures illustrated in FIGS. 4A to 4C. In some embodiments, no vertical connections, for example conductive vias are provided in the semiconductor body between the diode structure 90 positioned in the substrate 25 and an upper surface of the semiconductor body or the source of the low side switch 28. The diode structures may be used in a semiconductor device including a Group III nitride-based monolithically integrated half bridge circuit on a common foreign substrate, for example the semiconductor device 20.

In the embodiments illustrated in FIGS. 4A to 4C, the common foreign substrate 25 is a silicon substrate which is lightly doped with a second conductivity type, for example the substrate 25 is lightly p-doped.

In the embodiment illustrated in FIG. 4A, the diode structure 90 includes the substrate 25 and an island 91 formed of silicon that is doped with the first conductivity type, e.g. n-type if the substrate is p-doped, is formed on the lightly doped silicon substrate 25. The island 91 may be formed by implanting n-type dopants into the substrate 25 or may be formed by epitaxial deposition of a substantially planar layer that is doped with the first conductivity type. The diode structure 90 further includes an island 92 of the second conductivity type which is positioned on the island 91 of the first conductivity type. The island 92 of the second conductivity type may be formed by implantation or by epitaxial growth of a further layer doped with the second conductivity type. The island 92 is heavily doped with the second conductivity type. The upper island 91 of the second conductivity type is laterally smaller than the lower island 91 of the first conductivity type.

FIG. 4B illustrates a diode structure 90' according to an embodiment that may be used in the semiconductor device 20. The diode 90' is formed in the common foreign substrate 25, which as in the embodiment illustrated in FIG. 4a is formed of a silicon substrate 25 lightly doped with the second conductivity type, which is p-type in this embodiment. In the diode 90', a well 93 doped with the first conductivity type (n-type if the substrate 25 is p-type) is formed in an upper surface 44 of the substrate 25. The well 93 may be formed by selectively implanting an n-type dopant into the upper surface 44 of the lightly p-doped substrate 25. A layer 94, which is heavily doped with a second conductivity type, (p-type if the substrate 25 is p-type) is formed on the upper surface 44 of the substrate 25 and on the well 93.

In this embodiment, a trench 95 is formed which extends through the layer 94 and into the upper surface 44 to laterally define the extent of the layer 94 and form an island whilst leaving a ring 96 of the material of the layer 94 that is positioned on the upper surface 44 of the substrate 25 and that laterally surrounds and is spaced apart from the island of the upper layer 93. This ring 96 of the heavily doped heavily p-doped material forms a p-doped edge termination structure for the diode 90'. In some embodiments, the n-doped well 93 is exposed in the base of the trench 95 such that a ring-shaped region of the upper surface 44 of the substrate 25 surrounds the island 93 and a ring-shaped region of the upper surface of the island 93 is positioned laterally adjacent the base of the layer 94.

FIG. 4C illustrates an embodiment of a diode structure 90" which includes a well 93', that is doped with the first conductivity type, (e.g. n-type if the substrate 25 is p-type) positioned in the upper surface 44 of silicon substrate 25 lightly doped with the second conductivity type, e.g. p-type. A well 97 that is heavily doped with the second conductivity type formed within the lateral within the well 93' doped with the opposing conductivity type. The well 97 has a lateral extent which is less than lateral extent of the well 93' such that peripheral regions of the well 93' laterally surround the well 97.

The diode 90" also includes a ring 96' which is doped with the second conductivity type, and which laterally surrounds and is spaced apart from the well 93' doped with the opposing conductivity type by a portion of the upper surface 44 of the common foreign substrate 25. In this embodiment, the ring 96' is formed by an implanted ring region formed in the upper surface 44 of the common substrate 25. The ring 96' is formed in the substrate 25 rather than being positioned on the upper surface 44 of the substrate 25 as in the embodiment illustrated in FIG. 4B. The ring 96' may be formed using the same process as the well 97 as they can include the same conductivity type and doping. The ring 96' provides an edge termination structure for the diode structure 90".

FIG. 5A illustrates a Group III nitride-based enhancement mode transistor device 100 which may be used in the half bridge circuit according to any one of the embodiments described herein and also in a semiconductor device including two or more gated devices monolithically integrated into a common Group III nitride-based semiconductor body positioned on a common foreign substrate.

The transistor device 100 includes a Group III nitride body 101 including a transition/nucleation region 102 arranged on a foreign substrate 103 and a device region 104 arranged on the transition region 102. The device region 104 includes a channel layer 105 and a barrier layer 106 positioned on the channel layer 105 and forming a heterojunction 107 therebetween. In the case of some transistor devices, such as HEMTs, the heterojunction 107 is capable of supporting a two-dimensional charge gas, for example a two-dimensional electron gas, which is formed by spontaneous and piezoelectric polarisation.

The transistor device 100 includes a source 108, a gate 109 and drain 110 arranged on the barrier layer 106. The gate 109 is positioned laterally between the source 108 and the drain 110. The gate 109 may include a p-doped region 111 positioned between the barrier layer 106 and a metal gate 112 so that the transistor device 100 is an enhancement mode device.

In some embodiments, the drain 110 includes a p-doped region 113 which is electrically coupled to the metallic drain 110 to form a so-called hybrid drain arrangement. The p-doped region 113 may be arranged laterally between the gate 109 and the drain 110 and is spaced apart from the p-doped region 111 positioned under the gate metal 112.

In the transistor device 100 illustrated in FIG. 5A, a p-doped region 114 is provided which is electrically coupled to the metal source 108 such that the source has a hybrid source arrangement. The p-doped region 114 acts as a hole injector which is electrically coupled to the source 108 and which is positioned laterally between the source 108 and the gate 109. The source 108 is typically connected to an overlying source contact 115 which has a lateral extent which is greater than the source 108 and which, in some embodiments extends over and is electrically insulated from the gate 109 by one or more electrically insulating layers 116. Gate 109 is covered by the electrically insulating layer 116 which may also be arranged between the p doped region 110 of the gate 109 and the source contact 108. The transistor device also includes a drain electrode 117 arranged on the drain 110. The transistor device 100 may be used as the high side switch in a monolithically integrated half bridge circuit, for example the high side switch 29 of the half bridge circuit 30.

FIG. 5B illustrates a graph of gate source voltage VGS against time for the high side switch (HSS) and the low side switch (LSS) and VSW of a half-bridge bridge circuit against time. Both the low side switch and the high side switch have a hybrid source structure including a p-doped source region 114 electrically coupled to the source.

In time period 120, the gate source voltage of the low side switch is reduced, to −4V in this embodiment, to switch off the low side switch and, afterwards, in time period 121 a voltage is applied to the gate of the high side switch to turn on the high side switch. Then the voltage is removed from the gate of the high side switch to switch off the high side switch. Subsequently, in time period 122, a voltage is applied to the low side switch to switch the low side switch on again. In the time period 123, which lies between time periods 120 and 121, both the low side switch and the high side switch are turned off and a positive voltage is not applied to the gate of either the low side switch or high side switch. FIG. 5B illustrates soft switching of the half bridge circuit.

In the time period 123, it is thought that a diode formed between the p-doped region 114 that is coupled to the source 108 and the channel region switches on and injects holes preventing depletion of the two-dimensional electron gas. This is illustrated by the current $I_{L2}$ through the high side switch illustrated in FIG. 5A and the equivalent circuit diagram of FIG. 5C. During this time period 123, a current $I_{L1}$ also flows through the low side switch as shown in FIG. 5C.

FIG. 5D illustrates the circuit during the first period 124 of the on-state of the high side switch, i.e. time period 121 of FIG. 5A, and illustrates that the p-doped region 114 that is coupled to the source 108 may still inject holes preventing depletion of the two-dimensional electron gas. The total current $I_L$ flows through the high side switch is indicated in the equivalent circuit diagram of FIG. 5D and a schematic diagram of the high side switch in FIG. 5E. Consequently, there is little, if any, increase in $V_{SW}$ compared to the desired value $V_{BUS}$ during the initial on period, 124, of the high side switch, as shown in figure 5B. In this period for soft-switching, $V_{SW}$ is higher than $V_{BUS}$. If there is no 2DEG depletion in the channel as desired, the increase in $V_{SW}$ is small. On the other hand, if there is some 2DEG depletion, then $V_{SW}$ becomes higher than the case without 2DEG depletion.

In other embodiments, a transistor device including a p-doped source region electrically coupled to the source, for example the transistor device 100 illustrated in FIG. 5A, is driven using a multi-level gate driving scheme that includes at least three levels according to any one of the embodiments described herein.

Figure 6:
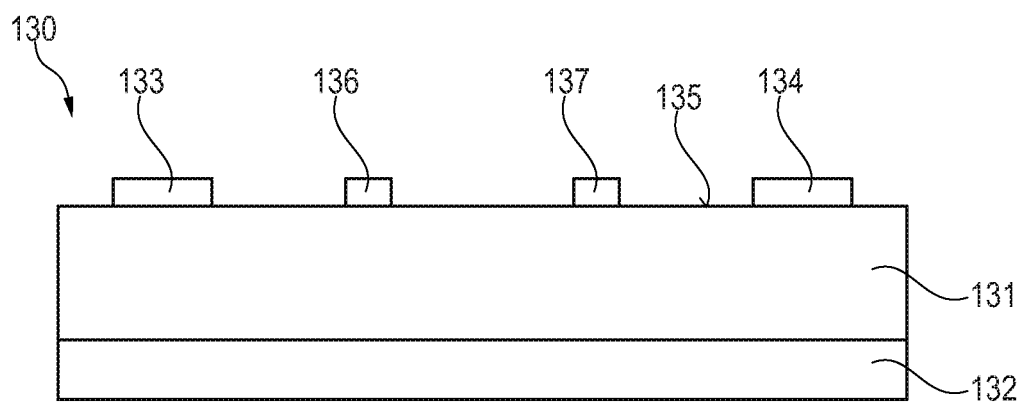
FIG. 6 illustrates a schematic view of a bidirectional switch according to an embodiment.

FIG. 6 illustrates a schematic view of a bidirectional switch 130 which comprises a III-V semiconductor body 131 arranged on a substrate 132. The III-V semiconductor body 131 may comprise a multilayer Group III nitride structure and the substrate may comprise silicon, for example. The bidirectional switch 130 includes a first input/output contact 133 and a second input/output contact 134 arranged on an upper surface 135 of the semiconductor body 131. The bidirectional switch 130 also comprises two gate contacts 136, 137 which are arranged on the upper surface 135 lateral between and spaced apart from the first and second input/output contacts 133, 134 and spaced apart from one another. In some embodiments, a single gate contact is provided. One or both of the gate contacts 136, 137 may be driven using the gate driver according to one of the embodiments described herein.

The bidirectional switch 130 may be formed in a semiconductor body 131 having a multilayer Group III nitride structure according to any one of the embodiments described herein.

The bidirectional switch 130 may have a common drain structure in which one input/output contact is shared by two neighbouring devices, whereby a single gate electrode is arranged on opposing sides of the shared or common input/output contact.

In some embodiments of the bidirectional switch 130, a p-doped Group III nitride region that is coupled to the first input/output contact 133 and/or a p-doped Group III nitride region that is coupled to the second input/output contact 134 can be omitted as a charge source or hole injector and the second gate can be used as the hole injector.

As discussed above, the III-V semiconductor body, such as the Group III nitride-based epitaxial structure of the semiconductor body 21 of the semiconductor device 20 illustrated in FIG. 1, may have a capacitive effect in which the semiconductor body effectively acts as a capacitor in which the two-dimensional electron gas forms the top electrode, the substrate 25 forms the bottom electrode and the Group III nitride-based epitaxial structure between the two dimensional electron gas and the substrate 25 forms the dielectric of the capacitor structure, which leads to the depletion of 2DEG and the increase in a parasitic resistance Rs when the top electrode of this capacitor is at high positive potential with respect to the bottom electrode so that the actual drain source current Ids of the device, such as the high side switch of a monolithically integrated half bridge is smaller than expected.

It is thought that this capacitive effect is reduced or eliminated by the embodiments described herein so that this can be harnessed to increase the voltage at which a switching circuit can be operated. In some embodiments, a switching circuit is provided that comprises a Group III nitride-based semiconductor body comprising a first and monolithically integrated Group III nitride-based transistor device coupled to form a half-bridge circuit that are arranged on a common foreign substrate comprising a common doping level. The switching circuit is configured to operate the half-bridge circuit at a voltage of at least 300V, for example at least 450V.

In some embodiments, the switching circuit comprises a hole injector which is operable to periodically inject holes into a buried layer positioned vertically between the two-dimensional electron gas and the common foreign substrate. The hole injector may, therefore, be switchable. The buried layer may be formed by a portion of the channel layer, or buffer structure of a Group III nitride-based semiconductor body for example so that the term "buried layer" does not necessarily indicate an additional structure.

The buried layer may be arranged in the second monolithically integrated Group III nitride-based transistor device which provides the high side switch of the half bridge circuit, since the formation of the parasitic resistance in the high side switch may reduce the drain source current.

In some embodiments, the switchable hole injector is positioned vertically above and spaced apart from the two-dimensional charge gas, for example the switchable hole injector may be positioned on the channel layer. In some embodiments, the switchable hole injector is a doped region of the second conductivity type that is coupled to the source contact, or is provided by a gate driver coupled to and operating the gate.

In some embodiments, this capacitive effect of the semiconductor body is reduced or eliminated by a method of operating a transistor device in which the two-dimensional charge gas periodically shielding from the substrate by a periodic injection of charges of the second conductivity type from a charge source. The charge source may be a p-doped region coupled to source or a gate driver.

This method can be used to operate a transistor device, such as the transistor device 29 of the semiconductor device 20 illustrated in FIG. 1 or the transistor device 100 illustrated in FIG. 5A.

The transistor device 100 may comprise a group III nitride-based body 101 comprising a transition region 102 arranged on a foreign substrate 103 and a device region 104 arranged on the transition region 102, the device region 104 comprising a barrier layer 106 arranged on a channel layer 105 forming a heterojunction 107 therebetween that is capable of supporting a two dimensional charge gas of a first conductivity type, a source contact 115, a gate 109 and a drain contact 117 arranged on the barrier layer 106.

The transistor device 100 typically has a breakdown density of charges that can be determined. In some embodiments, an amount of charges that is at least half the breakdown density is periodically injected to provide the periodic shielding of the two-dimensional charge gas from the substrate 102.

The charges of a second conductivity type that are injected from the charge source may serve to increase a density of charges of the second conductivity type for a predetermined period of time in a region of the Group III nitride-based body arranged vertically between the two dimensional charge gas of the first conductivity type and the foreign substrate 102, and after expiry of the predetermined period of time the method comprises stopping injecting charges of the second conductivity from the charge source.

The charge source may be positioned vertically above and spaced apart from the two dimensional charge gas, for example on the barrier layer 106.

The region of the Group III nitride-based body, in which the density of charges of the second conductivity type is increased, may be vertically spaced apart from the two-dimensional charge gas of the first conductivity type from the heterojunction 107 and vertically spaced apart from the foreign substrate 102. The region may extend continuously from the source contact 115 to the drain contact 117 and laterally under the source contact 115 and under the drain contact 117.

In some embodiments, the charges of the second conductivity type are injected during an initial period of an on-cycle of the transistor device 100.

In some embodiments, the charge density of the region capacitively decouples the foreign substrate 102 from the two-dimensional charge gas during the predetermined period of time.

In some embodiments, the transistor device 100 is coupled with a further transistor device, e.g. the low side switch 28 illustrated in FIG. 1, to form a half-bridge circuit and the transistor device and the further transistor device are monolithically integrated in a common semiconductor body that is arranged on a common foreign substrate.

In embodiments in which the transistor device 100 provides the high side switch and the further transistor device 28 provides the low side switch of the half-bridge circuit, the method may further comprise during an on-cycle of the low side switch 28 stopping injecting charges of the second conductivity type from the charge source, and during an on-cycle of the high side switch 100 injecting charges of the second conductivity type from the charge source 114 during a first time period as the gate 109 is switched on and stopping injecting charges of the second conductivity from the charge source 114 during a second time period subsequent to the first time period as the gate 109 is maintained in an on state.

The gate driver scheme according to any one of the embodiments described herein may also be used for a discrete Group III nitride transistor device, such as a discrete Group III nitride enhancement mode HEMT and is not limited to use for devices including two or more Group III nitride devices monolithically integrated in a common substrate.

The gate driver and method for switching according to any one of the embodiments described herein is not limited to use with Group III nitride enhancement mode transistor devices and may be used for other transistor devices. In further embodiments, the principles of the gate driver and method according to any one of the embodiments described herein are used for switching a Group III nitride depletion mode transistor device, which is normally-on. The Group III nitride depletion mode transistor device may be a discrete device or be monolithically integrated in a common substrate with one or more further Group III nitride devices.

In some embodiments, the depletion mode Group III nitride transistor device, for example a depletion mode Group III nitride HEMT, includes a gate including a p-doped Group III nitride layer under a metallic gate. However, the distance between the gate p-doped Group III nitride layer and the two dimensional electron gas is sufficiently large that the two dimensional electron gas is fully depleted so that the device is normally on.

In some embodiments, the Group III nitride depletion mode transistor device is driven using a gate voltage rather than a gate current.

In the off state, a negative voltage is supplied to the gate of a Group III nitride depletion mode transistor device that is smaller than the negative threshold voltage of the device, for example −3V or less. To switch on the Group III nitride depletion mode transistor device, a voltage $V_{g1}$ is supplied to the gate that is sufficient to switch on the diode that is formed between the gate including the p-doped layer and the two dimensional electron gas in order to inject holes. This voltage $V_{g1}$ may be greater than +3V or greater than +4V. This voltage may be applied as a short pulse, similar to that used for the enhancement mode Group III nitride transistor device to produce the gate current $Ig_1$ in the first time period.

A voltage $V_{g2}$ of around 0 is then supplied to the gate in the next level of the multilevel gate driver to produce a gate current $Ig_2$ and to maintain the on state of the device, whereby the voltage may be slightly greater or less than 0V. As for the enhancement mode Group III nitride device, $Ig_1 > 5Ig_2$, or $Ig_1 > 10Ig_2$, whereby there is an additional condition that $V_{g1} \geq 3V$ or $V_{g1} \geq 3V$.

In an embodiment, a multi-level gate driver for a Group III nitride-based depletion mode transistor device comprising a source, a gate and a drain is provided, wherein during an on-cycle of the Group III nitride-based depletion mode transistor device the gate driver is configured to supply the gate with a first gate voltage $Vg_1$ during a first time period so that a first gate current $Ig_1$ is applied during the first time period that is sufficient to turn on the gate and maintain the gate in an on-state and to supply the gate with a second gate voltage $V_{g2}$ during a second time period subsequent to the first time period so that a second gate current $Ig_2$ is applied to the gate during the second time period to maintain the gate in an on state, wherein $V_{g1} \geq 3V$ or $V_{g1} \geq 3V$ and $Ig_1 > 5Ig_2$, or $Ig_1 > 10Ig_2$. $Vg_2$ is around 0V.

To switch off and maintain the Group III nitride-based depletion mode transistor device in the switched-off state, for example after the second time period, the gate driver is configured to supply the gate with a voltage $V_{off}$, wherein $V_{off} < 0V$, for example $V_{off} < -3V$.

The following examples are also provided:

Example 1. A multi-level gate driver for a Group III nitride-based enhancement mode transistor device comprising a source, a gate and a drain,
  i. wherein during an on-cycle of the Group III nitride-based enhancement mode transistor device the gate driver is configured to:
  ii. supply the gate with a first gate voltage during a first time period so that a first gate current $Ig_1$ is applied during the first time period that is sufficient to turn on the gate and maintain the gate in an on-state and
  iii. supply the gate with a second gate voltage during a second time period subsequent to the first time period so that a second gate current $Ig_2$ is applied to the gate during the second time period to maintain the gate in an on state, wherein $Ig_1 > 5Ig_2$, or $Ig_1 > 10Ig_2$, or alternatively during an on-cycle of the Group III nitride-based enhancement mode transistor device the gate driver is configured to:
  i. supply the gate with a first gate current $Ig_1$ during a first time period, wherein $Ig_1$ is sufficient to turn on the gate and maintain the gate in an on-state and
  ii. supply the gate with a second gate current $Ig_2$ during a second time period subsequent to the first time period, wherein $Ig_2$ maintains the gate in an on state,
  iii. wherein $Ig_1 > 5Ig_2$, or $Ig_1 > 10Ig_2$.

Example 2. A gate driver according to example 1, wherein the second time period is contiguous to the first time period.

Example 3. A gate driver according to example 1 or claim 2, wherein $0.24\ \mu A/\mu m^2 \leq Ig_1 \leq 7.21\ \mu A/\mu m^2$ and/or $2.4\ nA/\mu m^2 \leq Ig_2 \leq 0.24\ \mu A/\mu m^2$ and/or the first time period lies in the range of 10 ns to 3 μs, or 50 ns to 3 μs, or 100 ns to 3 μs, or, or 500 ns to 3 μs, or 1 μs to 3 μs.

Example 4. A gate driver according to one of examples 1 to 3, wherein in a further on-cycle of the Group III nitride-based enhancement mode transistor device the gate driver is configured to:
  i. supply the gate with a single gate voltage during an entire time period of the on-cycle, or wherein in a further on-cycle of the Group III nitride-based enhancement mode transistor device the gate driver is configured to:
  i. supply the gate with a single gate current during an entire time period of the on-cycle.

Example 5. A gate driver according to one of examples 1 to 4, wherein the gate driver is further configured to supply a third gate voltage to switch off the gate or the gate driver is further configured to supply a third gate current to switch off the gate.

Example 6. A gate driver according to example 5, wherein the gate driver is further configured to supply a third gate voltage is supplied to switch off the gate, the third gate voltage being negative, followed by a fourth gate voltage that is around 0.

Example 7. A gate driver according to one of examples 1 to 6, wherein
  i. a fifth gate voltage is applied to the gate in an initial time period, prior to the first time period, so that an initial gate current $Ig_0$ is applied to turn on the gate and maintain the gate in an on-state, wherein $Ig_0 < Ig_1$, or
  ii. the gate is supplied with an initial gate current $Ig_0$ during an initial time period prior to the first time period to turn on the gate, wherein $Ig_0 < Ig_1$.

Example 8. A gate driver according to one of examples 1 to 6, wherein
  i. the gate is supplied with the first gate voltage during the first time period so that the first gate current $Ig_1$ turns on the gate, or
  ii. the gate is supplied with a first gate current $Ig_1$ during the first time period to turn on the gate.

Example 9. A gate driver according to one of examples 1 to 8, wherein the gate driver comprises:
  i. a first linear voltage regulator (LDO) coupled in parallel with a second LDO,
  ii. the output of the first LDO being coupled in series with a switch that is coupled to an output node,
  iii. the output of the second LDO being coupled in series with a bidirectional switch that is coupled to the output node,
  iv. a first capacitor coupled between the output of the first LDO and the output of the second LDO,
  v. a second capacitor coupled between the output of the second LDO and the low voltage node,
  vi. a switch coupled between the second capacitor and the output node,
  vii. wherein when the switch coupled between the output of the first LDO and the output node is switched on, a first voltage is supplied to the output node and wherein when the bidirectional switch is switched on, a second voltage is supplied to the output node. wherein the first voltage is greater than the second voltage.

Example 10. A gate driver according to one of examples 1 to 9, wherein the transistor device is an enhancement mode device and is monolithically integrated in a group III nitride-based semiconductor body that comprises a further monolithically integrated Group III nitride-based enhancement mode transistor device,
  i. wherein a source of the transistor device is coupled to a drain of the further monolithically integrated Group III nitride-based enhancement mode transistor device to form a half-bridge configuration, the transistor device and the further monolithically integrated Group III nitride-based enhancement mode transistor device being arranged on a common substrate.

Example 11. A gate driver according to one of examples 1 to 9, wherein the transistor device is an enhancement mode device and is monolithically integrated in a group III nitride-based semiconductor body that comprises a further monolithically integrated Group III nitride-based enhancement mode transistor device,
  i. wherein the transistor device and the further monolithically integrated Group III nitride-based enhancement mode transistor device are coupled to form a bidirectional switch and are arranged on a common foreign substrate.

Example 12. A gate driver according to example 10 or example 11, wherein the common substrate is coupled to ground potential.

Example 13. A power switching circuit, comprising
  i. a Group III nitride-based semiconductor body comprising:
  ii. a first monolithically integrated Group III nitride-based enhancement mode transistor device and
  iii. a second monolithically integrated Group III nitride-based enhancement mode transistor device,
  iv. a gate driver according to one of examples 1 to 8,
  v. wherein the first monolithically integrated Group III nitride-based enhancement mode transistor device and the second monolithically integrated Group III nitride-based enhancement mode transistor device are coupled to form a circuit with a load path and are arranged on a common substrate.

Example 14. A power switching circuit according to example 13, wherein a drain of the first monolithically integrated Group III nitride-based enhancement mode transistor devices is coupled to a source of the second monolithically integrated Group III nitride-based enhancement mode transistor device to form a half-bridge circuit.

Example 15. A power switching circuit according to example 13, wherein the first monolithically integrated Group III nitride-based enhancement mode transistor devices and the second monolithically integrated Group III nitride-based enhancement mode transistor device are coupled to form a bidirectional switch.

Example 16. A power switching circuit according to one of claims 13 to 15, further comprising a diode comprising an anode and a cathode, wherein the anode is coupled to a node having the lowest potential and the cathode is coupled to the common substrate.

Example 17. A power switching circuit according to example 16, wherein the diode is integrated into the common substrate.

Example 18. A power switching circuit according to example 17, wherein
  i. the common substrate is a p-doped substrate and comprises a n-doped island on the p-doped substrate to form the diode, the group III nitride semiconductor body being arranged on the n-doped island or
  ii. the common substrate is a p-doped substrate and comprises a n-doped island on the p-doped substrate and a p-doped layer on the n-doped island to form the diode, the group III nitride semiconductor body being arranged on the p-doped layer, or
  iii. the common substrate is a p-doped substrate and comprises a n-doped well in the p-doped substrate and a p-doped layer arranged on n-doped well to form the diode, wherein the p-doped layer is further arranged on the p-doped substrate, the p doped layer comprising trenches that completely interrupt the p-doped layer adjacent the n-doped well, the group III nitride semiconductor body being arranged on the p-doped layer, or
  iv. the common substrate is a p-doped substrate and comprises a n-doped well in the p-doped substrate to form the diode and a p-doped ring arranged in p-doped substrate that is laterally spaced apart from the n-doped well, the group III nitride semiconductor body being arranged on the n-doped well, or
  v. the common substrate is a p-doped substrate and comprises a n-doped well in the p-doped substrate and a p-doped well in the n-doped well to form the diode and a p-doped ring arranged in p-doped substrate that is laterally spaced apart from the n-doped well, the group III nitride semiconductor body being arranged on the p-doped well.

Example 19. A Group III nitride-based enhancement mode transistor device comprising:
  i. a group III nitride-based body comprising a transition region arranged on a foreign substrate and a device region arranged on the transition region, the device region comprising a barrier layer on a channel layer and forming a heterojunction capable of supporting a two-dimensional charge gas,
  ii. a source and gate and a drain arranged on the barrier layer, the gate being arranged laterally between the source and the drain, wherein the source comprises at least one hole injector region electrically coupled to the source and positioned laterally between the source and the gate.

Example 20. A Group III nitride-based enhancement mode transistor device according to example 19, wherein the hole injector region comprises a p-doped Group III nitride region arranged on the barrier layer.

Example 21. A Group III nitride-based enhancement mode transistor device according to example 19 or example 20, wherein the drain comprises at least one hole injector region electrically coupled to the drain and positioned laterally between the drain and the gate of the second transistor device Example 22. A Group III nitride-based enhancement mode transistor device according to one of examples 19 to 21, wherein the gate further comprises a p-doped Group III nitride region arranged between a metal gate and the barrier layer.

Example 23. A monolithically integrated Group III nitride based circuit comprising two or more switching devices, wherein two of the switching devices are coupled to form a half-bridge comprising a low side switch and a high side switch, wherein the high side switch comprises the Group III nitride-based enhancement mode transistor of any one of examples 19 to 22.

Example 24. A monolithically integrated Group III nitride-based circuit according to example 19, wherein the two or more switching devices are formed in a common Group III nitride-based body that is formed on a common foreign substrate.

Example 25. A monolithically integrated Group III nitride-based circuit according to example 23 or example 24, further comprising a gate driver according to one of examples 1 to 14.

Example 26. A monolithically integrated Group III nitride based circuit comprising two or more switching devices, wherein two of the switching devices are coupled to form a bidirectional switch, wherein the bidirectional switch comprises two Group III nitride-based enhancement mode transistors of any one of examples 19 to 22.

Example 27. A monolithically integrated Group III nitride based circuit, according to example 26, wherein the two Group III nitride-based enhancement mode transistors share a common drain.

Example 28. A monolithically integrated Group III nitride-based circuit according to example 26 or example 27, wherein the two or more switching devices are formed in a common Group III nitride-based body that is formed on a common foreign substrate.

Example 29. A monolithically integrated Group III nitride-based circuit according to any one of examples 26 to 28, further comprising a gate driver according to one of examples 1 to 14.

Example 30. A method of switching a Group III nitride-based enhancement mode transistor device comprising a source, a gate and a drain, the method comprising:
  i. during an on-cycle of the Group III nitride-based enhancement mode transistor device
  ii. supplying the gate with a first gate voltage during a first time period so that a first gate current $Ig_1$ is applied during the first time period that is sufficient to turn on the gate and maintain the gate in an on state, and
  iii. supplying the gate with a second gate voltage during a second time period subsequent to the first time period so that a second gate current $Ig_2$ is applied to the gate during the second time period to maintain the gate in an on state, wherein $Ig_1 > 5Ig_2$, or $Ig_1 > 10Ig_2$, or the method comprises:
  iv. supplying the gate with a first gate current $Ig_1$ during a first time period that is sufficient to turn on the gate and maintain the gate in an on state and
  v. supplying the gate with a second gate current $Ig_2$ during a second time period subsequent to the first time period to maintain the gate in an on state,
  vi. wherein $Ig_1 > 5Ig_2$, or $Ig_1 > 10Ig_2$.

Example 31. A method according to example 30, wherein the second time period is contiguous to the first time period.

Example 32. A method according to example 30 or claim 31, wherein 700 mA≤$Ig_1$≤2 A and 20 mA≤$Ig_2$≤100 mA, or wherein 0.24 µA/µm²≤$Ig_1$≤7.21 µA/µm² and/or 2.4 nA/µm²≤$Ig_2$≤0.24 µA/µm² and/or—the first time period lies in the range of 10 ns to 3 µs.

Example 33. A method according to one of examples 30 to 32, wherein in a further on-cycle of the Group III nitride-based enhancement mode transistor device the method comprises:
  i. supplying the gate with a single gate voltage during an entire time period of the on-cycle, or
  ii. in a further on-cycle of the Group III nitride-based enhancement mode transistor device the method comprises:
  iii. supplying the gate with a single gate current during an entire time period of the on-cycle.

Example 34. A method according to one of examples 30 to 33, further comprising supplying a third gate voltage to switch off the gate.

Example 35. A method according to example 34, wherein the third gate voltage is negative, or the third gate voltage is negative and is followed by a fourth gate voltage that is around 0.

Example 36. A method according to one of examples 30 to 35, further comprising
  i. applying a fifth gate voltage to the gate in an initial time period, prior to the first time period, so that an initial gate current $Ig_0$ is applied to turn on the gate and maintain the gate in an on state, wherein $Ig_0 < Ig_1$, or
  ii. further comprising:
  iii. supplying the gate with an initial gate current $Ig_0$ during an initial time period prior to the first time period to turn on the gate and maintain the gate in an on state, wherein $Ig_0 < Ig_1$.

Example 37. A method according to one of examples 30 to 36, wherein
  i. the gate is supplied with the first gate voltage during the first time period so that the first gate current $Ig_1$ turns on the gate and maintain the gate in an on state, or
  ii. the gate is supplied with a first gate current $Ig_1$ during the first time period to turn on the gate and maintain the gate in an on state.

Example 38. A method according to one of examples 30 to 37, wherein the Group III nitride-based enhancement mode transistor device is a high side switch of a half-bridge circuit.

Example 39. A method according to example 38, wherein the half bridge circuit further comprises a further Group III nitride-based enhancement mode transistor device configured to provide a low side switch of the half-bridge circuit, the method further comprising:
  i. during an on-cycle of the low side switch supplying a gate of the further Group III nitride-based enhancement mode transistor device with a single gate voltage or a single gate current, and ii. during an on-cycle of the high side switch supplying the gate of the Group III nitride-based enhancement mode transistor device with a first gate voltage during a first time period so that a first gate-source current $Ig_{s_1}$ is applied to turn on the gate and maintain the gate in an on state, and iii. supplying the gate of the Group III nitride-based enhancement mode transistor device with a second gate voltage during a second time period subsequent to the first time period so that a second gate source current $Ig_{s_2}$ is applied to the gate to maintain the gate in an on state, wherein $Ig_1 > 5 Ig_2$, preferably $Ig_1 > 10 Ig_2$.

Example 40. A method of operating a transistor device, the transistor device comprising a group III nitride-based body comprising a transition region arranged on a substrate and a device region arranged on the transition region, the device region comprising a barrier layer arranged on a channel layer forming a heterojunction therebetween that is capable of supporting a two dimensional charge gas of a first conductivity type, a source contact, a gate and a drain contact arranged on the barrier layer, the method comprising:

i. periodically shielding the two dimensional charge gas from the substrate by a periodic injection of charges of the second conductivity type from a charge source.

Example 41. A method of operating a transistor device according to example 40, wherein the transistor device has a break down density of charges and an amount of charges that is at least half the breakdown density is periodically injected to provide the periodic shielding of the two dimensional charge gas from the substrate.

Example 42. A method according to example 40 or example 41, wherein the charges of a second conductivity type that are injected from the charge source increase a density of charges of the second conductivity type for a predetermined period of time in a region of the Group III nitride-based body arranged vertically between the two dimensional charge gas of the first conductivity type and the foreign substrate, and i. after expiry of the predetermined period of time the method comprises stopping injecting charges of the second conductivity from the charge source.

Example 43. A method according to one of examples 40 to 42, wherein the charge source is positioned vertically above and spaced apart from the two dimensional charge gas.

Example 44. A method according to one of examples 40 to 43, wherein the charge source is positioned on the channel layer.

Example 45. A method according to one of examples 40 to 44, wherein the charge source is a doped region of the second conductivity type that is coupled to the source contact.

Example 46. A method according to one of examples 40 to 45, wherein the charge source is provided by a gate driver coupled to the gate.

Example 47. A method according to one of examples 40 to 46, wherein the charges are periodically injected from the charge source into a region of the Group III nitride-based body that is arranged between the two dimensional charge gas and the foreign substrate and is vertically spaced apart from the two dimensional charge gas and vertically spaced apart from the substrate.

Example 48. A method according to example 47, wherein the region extends continuously from the source contact to the drain contact.

Example 49. A method according to example 48, wherein the region extends laterally under the source contact and under the drain contact.

Example 50. A method according to one of examples 40 to 49, wherein the charges of the second conductivity type are injected during an initial period of an on-cycle of the transistor device.

Example 51. A method according to one of examples 40 to 50, wherein the charge density of the region capacitively decouples the foreign substrate from the two-dimensional charge gas during the predetermined period of time.

Example 52. A method according to one of examples 40 to 51, wherein the transistor is a Group III nitride-based transistor device.

Example 53. A method according to one of examples 40 to 52, wherein the transistor device is coupled with a further transistor device to form a half-bridge circuit and the transistor device and the further transistor device are monolithically integrated in a common semiconductor body that is arranged on a common substrate.

Example 54. A method according to example 53, wherein the common semiconductor body comprises an epitaxial multilayer structure.

Example 55. A method according to one of examples 40 to 54, wherein the transistor device provides the high side switch and the further transistor device provides the low side switch of the half-bridge circuit, the method further comprising:

i. during an on-cycle of the low side switch stopping injecting charges of the second conductivity type from the charge source into the transistor device providing the high side switch, and ii. during an on-cycle of the high side switch injecting charges of the second conductivity type from the charge source during a first time period as the gate is switched on and maintain the gate in an on state and iii. stopping injecting charges of the second conductivity from the charge source into the transistor device providing the high side switch during a second time period subsequent to the first time period as the gate is maintained in an on state.

Example 56. A switching circuit, comprising:

i. a Group III nitride-based semiconductor body comprising:

ii. a first monolithically integrated Group III nitride-based transistor device;

iii. a second monolithically integrated Group III nitride-based transistor device, iv. wherein the first monolithically integrated Group III nitride-based transistor devices and the second monolithically integrated Group III nitride-based transistor devices are coupled to form a half-bridge circuit and are arranged on a common substrate comprising a common doping level, v. wherein the switching circuit is configured to operate the half-bridge circuit at a voltage of at least 300V.

Example 57. A switching circuit according to example 56, wherein the Group III nitride-based semiconductor body comprises i. a transition region arranged on a substrate and a device region arranged on the transition region, the device region comprising a barrier layer arranged on a channel layer forming a heterojunction therebetween that is capable of supporting a two dimensional charge gas of a first conductivity type;

ii. the first and second monolithically integrated Group III nitride-based transistor devices being formed in the device region.

Example 58. A switching circuit according to example 56 or example 57, wherein the switching circuit further comprises a hole injector, the hole injector being operable to periodically inject holes into a buried layer positioned vertically between the two-dimensional electron gas and the common substrate.

Example 59. A switching circuit according to example 58, wherein the buried layer is arranged in the second monolithically integrated Group III nitride-based transistor device or in the first monolithically integrated Group III nitride-based transistor device.

Example 60. A switching circuit according to example 58 or example 59, wherein the hole injector is positioned vertically above and spaced apart from the two dimensional charge gas.

Example 61. A switching circuit according to one of examples 58 to 60, wherein the hole injector is positioned on the channel layer.

Example 62. A switching circuit according to one of examples 58 to 61, wherein the switchable hole injector is a doped region of the second conductivity type that is coupled to the source contact.

Example 63. A switching circuit according to one of examples 58 to 61, wherein the hole injector is provided by a gate driver coupled to the gate.

Example 64. A switching circuit according to one of examples 56 to 63, wherein the first monolithically integrated Group III nitride-based transistor devices and the second monolithically integrated Group III nitride-based transistor devices are coupled to form a half-bridge circuit and the first monolithically integrated Group III nitride-based transistor device provides the low side switch and the second monolithically integrated Group III nitride-based transistor devices provides the high side switch of the half-bridge circuit.

Example 65. A switching circuit according to one of examples 56 to 64, wherein the first and second monolithically integrated Group III nitride-based transistor devices are enhancement mode devices or depletion mode devices.

Example 66. A switching circuit according to one of examples 56 to 65, wherein the first and second monolithically integrated Group III nitride-based transistor devices each comprise a p-doped region between a metal gate and the barrier layer.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A multi-level gate driver for a Group III nitride-based enhancement mode transistor device comprising a source, a gate and a drain,
   wherein during an on-cycle of the Group III nitride-based enhancement mode transistor device, the multi-level gate driver is configured to:
      supply the gate with a first gate voltage during a first time period so that a first gate current $Ig_1$ is applied during the first time period that is sufficient to turn on the gate and maintain the gate in an on-state; and
      supply the gate with a second gate voltage during a second time period subsequent to the first time period so that a second gate current $Ig_2$ is applied to the gate during the second time period to maintain the gate in an on state, wherein $Ig_1 > 5Ig_2$, or $Ig_1 > 10Ig_2$, or
   wherein during an on-cycle of the Group III nitride-based enhancement mode transistor device the multi-level gate driver is configured to:
      supply the gate with a first gate current $Ig_1$ during a first time period, wherein $Ig_1$ is sufficient to turn on the gate and maintain the gate in an on-state; and
      supply the gate with a second gate current $Ig_2$ during a second time period subsequent to the first time period, wherein $Ig_2$ maintains the gate in an on state, wherein $Ig_1 > 5Ig_2$, or $Ig_1 > 10Ig_2$.

2. The multi-level gate driver of claim 1,
   wherein in a further on-cycle of the Group III nitride-based enhancement mode transistor device, the multi-level gate driver is configured to supply the gate with a single gate voltage during an entire time period of the on-cycle, or
   wherein in a further on-cycle of the Group III nitride-based enhancement mode transistor device the multi-level gate driver is configured to supply the gate with a single gate current during an entire time period of the on-cycle.

3. The multi-level gate driver of claim 1,
   wherein the multi-level gate driver is further configured to supply a third gate voltage to switch off the gate, or
   wherein the multi-level gate driver is further configured to supply a third gate current to switch off the gate.

4. The multi-level gate driver of claim 1, wherein the multi-level gate driver is further configured to supply a third gate voltage to switch off the gate, wherein the third gate voltage is 0, or wherein the third gate voltage is negative, or wherein the third gate voltage is negative and followed by a fourth gate voltage that is around 0, or wherein the third gate voltage is negative and followed by a fourth gate voltage that is negative.

5. The multi-level gate driver of claim 1,
   wherein the multi-level gate driver is further configured to apply a fifth gate voltage to the gate in an initial time period, prior to the first time period, so that an initial gate current $Ig_0$ is applied to turn on the gate and maintain the gate in an on state, wherein $Ig_0 < Ig_1$, or wherein the multi-level gate driver is further configured to supply the gate with an initial gate current $Ig_0$ during an initial time period prior to the first time period to turn on the gate and maintain the gate in an on state, wherein $Ig_0 < Ig_1$.

6. The multi-level gate driver of claim 1, wherein $0.24\ \mu A/\mu m^2 \le Ig1 \le 7.21\ \mu A/\mu m^2$.

7. The multi-level gate driver of claim 1, wherein $2.4\ nA/\mu m^2 \le Ig2 \le 0.24\ \mu A/m^2$.

8. The multi-level gate driver of claim 1, wherein the first time period lies in a range of 10 ns to 3 μs.

9. A power switching circuit, comprising
a Group III nitride-based semiconductor body comprising:
a first monolithically integrated Group III nitride-based enhancement mode transistor device and a second monolithically integrated Group III nitride-based enhancement mode transistor device; and
a multi-level gate driver,
wherein the first monolithically integrated Group III nitride-based enhancement mode transistor device and the second monolithically integrated Group III nitride-based enhancement mode transistor device are coupled to form a circuit with a load path and are arranged on a common substrate,
wherein during an on-cycle of the Group III nitride-based enhancement mode transistor device, the multi-level gate driver is configured to:
supply the gate with a first gate voltage during a first time period so that a first gate current $Ig_1$ is applied during the first time period that is sufficient to turn on the gate and maintain the gate in an on-state; and
supply the gate with a second gate voltage during a second time period subsequent to the first time period so that a second gate current $Ig_2$ is applied to the gate during the second time period to maintain the gate in an on state, wherein $Ig_1 > 5Ig_2$, or $Ig_1 > 10Ig_2$, or
wherein during an on-cycle of the Group III nitride-based enhancement mode transistor device the multi-level gate driver is configured to:
supply the gate with a first gate current $Ig_1$ during a first time period, wherein $Ig_1$ is sufficient to turn on the gate and maintain the gate in an on-state; and
supply the gate with a second gate current $Ig_2$ during a second time period subsequent to the first time period, wherein $Ig_2$ maintains the gate in an on state, wherein $Ig_1 > 5Ig_2$, or $Ig_1 > 10Ig_2$.

10. The power switching circuit of claim 9,
wherein a drain of the first monolithically integrated Group III nitride-based enhancement mode transistor devices is coupled to a source of the second monolithically integrated Group III nitride-based enhancement mode transistor device to form a half-bridge circuit, or
wherein a drain of the first monolithically integrated Group III nitride-based enhancement mode transistor device and a drain of the second monolithically integrated Group III nitride-based enhancement mode transistor device are coupled to form a bidirectional switch.

11. The power switching circuit of claim 9, further comprising a diode comprising an anode and a cathode, wherein the anode is coupled to a node having the lowest potential and the cathode is coupled to the common substrate.

12. The power switching circuit of claim 11, wherein the diode is integrated into the common substrate.

13. The power switching circuit of claim 12, wherein:
the common substrate is a p-doped substrate and comprises a n-doped island on the p-doped substrate to form the diode, the group III nitride semiconductor body being arranged on the n-doped island; or
the common substrate is a p-doped substrate and comprises a n-doped well in the p-doped substrate to form the diode, the group III nitride semiconductor body being arranged on the n-doped well; or
the common substrate is a p-doped substrate and comprises a n-doped well in the p-doped substrate and a p-doped layer arranged on n-doped well to form the diode, wherein the p-doped layer is further arranged on the p-doped substrate, the p doped layer comprising trenches that completely interrupt the p-doped layer adjacent the n-doped well, the group III nitride semiconductor body being arranged on the p-doped layer; or
the common substrate is a p-doped substrate and comprises a n-doped well in the p-doped substrate, to form the diode and a p-doped ring arranged in p-doped substrate that is laterally spaced apart from the n-doped well, the group III nitride semiconductor body being arranged on the n-doped well.

14. A method of switching a Group III nitride-based enhancement mode transistor device comprising a source, a gate and a drain, the method comprising:
during an on-cycle of the Group III nitride-based enhancement mode transistor device:
supplying the gate with a first gate voltage during a first time period so that a first gate current $Ig_1$ is applied during the first time period that is sufficient to turn on the gate and maintain the gate in an on state; and
supplying the gate with a second gate voltage during a second time period subsequent to the first time period so that a second gate current $Ig_2$ is applied to the gate during the second time period to maintain the gate in an on state, wherein $Ig_1 > 5Ig_2$,
or the method comprises:
during an on-cycle of the Group III nitride-based enhancement mode transistor device:
supplying the gate with a first gate current $Ig_1$ during a first time period that is sufficient to turn on the gate and maintain the gate in an on state; and
supplying the gate with a second gate current $Ig_2$ during a second time period subsequent to the first time period to maintain the gate in an on state, wherein $Ig_1 > 5Ig_2$, or $Ig_1 > 10Ig_2$.

15. The method of claim 14, wherein in a further on-cycle of the Group III nitride-based enhancement mode transistor device, the method comprises:
supplying the gate with a single gate voltage during an entire time period of the on-cycle; or
supplying the gate with a single gate current during an entire time period of the on-cycle.

16. The method of claim 14, wherein:
the gate is supplied with the first gate voltage during a first time period so that the first gate current $Ig_1$ turns on the gate and maintain the gate in an on state; or
the gate is supplied with a first gate current $Ig_1$ during a first time period to turn on the gate and maintain the gate in an on state; or
the method further comprises:
applying a fifth gate voltage to the gate in an initial time period, prior to the first time period, so that an initial gate current $Ig_0$ is applied to turn on the gate and maintain the gate in an on state, wherein $Ig_0 < Ig_1$; or the method further comprises:

supplying the gate with an initial gate current $Ig_0$ during an initial time period prior to the first time period to turn on the gate and maintain the gate in an on state, wherein $Ig_0 < Ig_1$.

17. The method of claim 14, wherein the Group III nitride-based enhancement mode transistor device is a high side switch of a half-bridge circuit, wherein the half bridge circuit further comprises a further Group III nitride-based enhancement mode transistor device configured to provide a low side switch of the half-bridge circuit, wherein the method further comprises:

during an on-cycle of the low side switch supplying a gate of the further Group III nitride-based enhancement mode transistor device with a single gate voltage or a single gate current.

18. The method of claim 14, wherein $0.24\ \mu A/\mu m^2 \leq Ig1 \leq 7.21\ \mu A/\mu m^2$.

19. The method of claim 14, wherein $2.4\ nA/\mu m^2 \leq Ig2 \leq 0.24\ \mu A/\mu m^2$.

\* \* \* \* \*

UNITED STATES PATENT AND TRADEMARK OFFICE
CERTIFICATE OF CORRECTION

PATENT NO. : 11,575,377 B2
APPLICATION NO. : 17/237649
DATED : February 7, 2023
INVENTOR(S) : H. Kim et al.

It is certified that error appears in the above-identified patent and that said Letters Patent is hereby corrected as shown below:

In the Claims

Column 34, Line 59 Claim 16, change "maintain" to -- maintains --.

Signed and Sealed this
Twenty-eighth Day of March, 2023

Katherine Kelly Vidal
Director of the United States Patent and Trademark Office